United States Patent
Chen et al.

(10) Patent No.: US 12,490,622 B2
(45) Date of Patent: Dec. 2, 2025

(54) DISPLAY PANEL AND MANUFACTURING METHOD THEREFOR, AND DISPLAY DEVICE AND DRIVING METHOD THEREFOR

(71) Applicants: Chengdu BOE Optoelectronics Technology Co., Ltd., Sichuan Province (CN); BOE Technology Group Co., Ltd., Beijing (CN)

(72) Inventors: Li Chen, Beijing (CN); Dongyu Gao, Beijing (CN); Zhenye Wei, Beijing (CN); Xiongyi Luo, Beijing (CN); Guangchao Liu, Beijing (CN); Jinglu Bai, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/697,951

(22) PCT Filed: Sep. 30, 2022

(86) PCT No.: PCT/CN2022/123090
§ 371 (c)(1),
(2) Date: Apr. 2, 2024

(87) PCT Pub. No.: WO2024/065615
PCT Pub. Date: Apr. 4, 2024

(65) Prior Publication Data
US 2025/0241163 A1    Jul. 24, 2025

(51) Int. Cl.
*G09G 3/3225*    (2016.01)
*H10K 59/12*    (2023.01)
(Continued)

(52) U.S. Cl.
CPC ........... *H10K 59/38* (2023.02); *G09G 3/3225* (2013.01); *H10K 59/1201* (2023.02);
(Continued)

(58) Field of Classification Search
CPC ....... H10K 59/32; H10K 59/35; G09G 3/3225
See application file for complete search history.

(56) References Cited

U.S. PATENT DOCUMENTS

2016/0380035 A1* 12/2016 Cho ................. H10K 50/17
257/40
2019/0181376 A1* 6/2019 Kim ................. H10K 59/173

* cited by examiner

Primary Examiner — Kevin M Nguyen
(74) Attorney, Agent, or Firm — Workman Nydegger

(57) ABSTRACT

A display panel includes: a first base substrate including sub-pixel areas; first light-emitting devices corresponding to the sub-pixel areas one by one; a first dam layer including first opening areas; first photoluminescent layers on a side of the first light-emitting devices away from the first base substrate and in at least part of the first opening areas; second light-emitting devices on a side of the first dam layer away from the first light-emitting devices; a second dam layer on a side of the second light-emitting devices away from the first base substrate and including second opening areas corresponding to the sub-pixel areas one by one; and second photoluminescent layers on a side of the second light-emitting devices away from the first base substrate and in at least part of the second opening areas. Orthographic projections of the second light-emitting devices do not overlap with the sub-pixel areas.

20 Claims, 11 Drawing Sheets

(51) Int. Cl.
*H10K 59/122* (2023.01)
*H10K 59/38* (2023.01)
*H10K 59/80* (2023.01)

(52) U.S. Cl.
CPC ......... *H10K 59/122* (2023.02); *H10K 59/873* (2023.02); *H10K 59/878* (2023.02)

DISPLAY PANEL AND MANUFACTURING METHOD THEREFOR, AND DISPLAY DEVICE AND DRIVING METHOD THEREFOR

CROSS REFERENCE TO RELATED APPLICATION

This application is a National Stage of International Application No. PCT/CN2022/123090 filed Sep. 30, 2022, the entire contents of which are incorporated herein by reference.

TECHNICAL FIELD

The disclosure relates to the field of display technology, and in particular, to a display panel and a manufacturing method therefor, and a display device and a driving method therefor.

BACKGROUND

The quantum dots have the advantages of wide color gamut and high efficiency, and have attracted much attention and research in recent years. At present, a quantum dot technology used in display products is photoluminescence quantum dot technology. However, in photoluminescence quantum dot display products, the utilization rate of excitation light is insufficient, and there is a problem of low conversion efficiency of front brightness.

SUMMARY

Embodiments of the disclosure provide a display panel, including:
a first base substrate including a plurality of sub-pixel areas;
a plurality of first light-emitting devices on a side of the first base substrate and corresponding to the sub-pixel areas one by one;
a first dam layer on a side of the first light-emitting devices away from the first base substrate and including first opening areas corresponding to the sub-pixel areas one by one;
a plurality of first photoluminescent layers on the side of the first light-emitting devices away from the first base substrate and in at least part of the first opening areas;
a plurality of second light-emitting devices on a side of the first dam layer away from the first light-emitting devices, where orthographic projections of the second light-emitting devices on the first base substrate do not overlap with the sub-pixel areas;
a second dam layer on a side of the second light-emitting devices away from the first base substrate and including second opening areas corresponding to the sub-pixel areas one by one; and
a plurality of second photoluminescent layers on the side of the second light-emitting devices away from the first base substrate and in at least part of the second opening areas.

In some embodiments, the display panel further includes:
a first pixel definition layer between the first photoluminescence layers and the second photoluminescence layers and including third opening areas corresponding to the second light-emitting devices one by one.

The first pixel definition layer includes a first light transmissive material, orthographic projections of the third opening areas on the first base substrate do not overlap with the sub-pixel areas, and the second light-emitting devices are arranged in the third opening areas.

In some embodiments, the first pixel definition layer has a transmittance greater than or equal to 80% for light with a wavelength greater than or equal to 380 nanometers and less than or equal to 780 nanometers.

In some embodiments, the first light-emitting device includes: a first anode, a first light-emitting layer and a first cathode stacked on the side of the first base substrate;
the display panel further includes:
a second base substrate between the second light-emitting devices and the second photoluminescent layers;
the second light-emitting device includes:
a second anode on a side of the second base substrate away from the second photoluminescence layers; where an orthographic projection of the third opening area on the second base substrate falls into an orthographic projection of the second anode on the second base substrate; and the second anode is a light transmissive electrode;
a second light-emitting layer on a side of the second anode facing the first dam layer in the third opening area; and
a second cathode on a side of the second light-emitting layer away from the second anode.

In some embodiments, a cross-sectional area of the third opening area in a direction parallel to a plane where the second base substrate is located gradually decreases in a direction in which the first base substrate points to the second base substrate.

In some embodiments, the first pixel definition layer includes a plurality of first reflective parts corresponding to the third opening areas one by one; and
orthographic projections of the third opening areas on the second base substrate fall into areas surrounded by orthographic projections of the first reflective parts on the second base substrate, and the orthographic projections of the first reflective parts on the second base substrate do not overlap with orthographic projections of the sub-pixel areas on the second base substrate.

In some embodiments, the first pixel definition layer includes first via holes penetrating in a thickness direction of the first pixel definition layer, and the first reflective parts are filled in the first via holes.

In some embodiments, the first reflective part includes a reflective metal material;
an orthographic projection of the first reflective part on the second base substrate does not overlap with an orthographic projection of the second anode on the second base substrate; and
the first reflective part is in contact with the cathode.

In some embodiments, the first reflective part includes a first refractive index material; and a refractive index of the second light-emitting layer is greater than a refractive index of the first refractive index material.

In some embodiments, a refractive index of the first light transmissive material is greater than the refractive index of the first refractive index material.

In some embodiments, the first reflective part surrounds the third opening area.

In some embodiments, the second dam layer includes: a first light transmissive part and a second reflective part on a side of the first light transmissive part away from the first base substrate; the first light transmissive part only transmits light emitted by the second light-emitting devices; and a refractive index of the first light transmissive part is greater than a refractive index of the second reflective part;

an angle between at least part of an interface between the first light transmissive part and the second reflective part and a direction perpendicular to a plane where the first base substrate is located is greater than 0 and less than 90°; and an orthographic projection of the second reflective part on the first base substrate covers an orthographic projection of the first light transmissive part on the first base substrate.

In some embodiments, a cross section of the second dam layer is a rectangle, and cross sections of the first light transmissive part and the second reflective part are both right triangles, in a direction perpendicular to the first base substrate.

In some embodiments, a cross section of the second dam layer is a triangle, and a cross section of the first light transmissive part is a triangle, in a direction perpendicular to the first base substrate.

In some embodiments, a cross section of the second dam layer is a trapezoid, and a cross section of the first light transmissive part is a trapezoid, in a direction perpendicular to the first base substrate.

In some embodiments, the cross section of the second dam layer and the cross section of the first light transmissive part are right-angled trapezoids in the direction perpendicular to the first base substrate.

In some embodiments, the cross-sectional area of the first light transmissive part is less than the cross-sectional area of the second dam layer, and the cross section of the first light transmissive part and the cross section of the second dam layer are similar in shape.

In some embodiments, the display panel further includes:
a first filling layer in contact with the second photoluminescent layers on a side of the second photoluminescent layers facing the second light-emitting device; where a refractive index of the first filling layer is less than a refractive index of the second photoluminescent layers.

In some embodiments, the sub-pixel areas include: a red sub-pixel area, a green sub-pixel area and a blue sub-pixel area; and the first light-emitting devices and the second light-emitting devices are all blue light-emitting devices; the plurality of first photoluminescent layers only include: a first red photoluminescent layer in the first opening area corresponding to the red sub-pixel area, and a first green photoluminescent layer in the first opening area corresponding to the green sub-pixel area; and the plurality of second photoluminescent layers only include: a second red photoluminescent layer in the second opening area corresponding to the red sub-pixel area, and a second green photoluminescent layer in the second opening area corresponding to the green sub-pixel area.

In some embodiments, the display panel further includes:
a refractive layer between the second light-emitting devices and the second dam layer, and including lens structures corresponding to the blue sub-pixel areas one by one.

In some embodiments, the first photoluminescent layer and the second photoluminescent layer each include quantum dots;
a thickness of the first photoluminescent layer is greater than a thickness of the second photoluminescent layer in a direction perpendicular to the first base substrate; and a mass fraction of the quantum dots in the first photoluminescent layer is greater than a mass fraction of the quantum dots in the second photoluminescent layer.

In some embodiments, the display panel further includes:
a first encapsulation layer between the first light-emitting devices and the first photoluminescent layers;
a second encapsulation layer between the second light-emitting devices and the first photoluminescent layers;
a first covering layer between the first photoluminescent layers and the second encapsulation layer; and
a first light transmissive adhesive layer between the second encapsulating layer and the first covering layer.

In some embodiments, the display panel further includes:
a first light-shielding layer located on a side of the second dam layer away from the first base substrate and including fourth opening areas corresponding to the sub-pixel areas one by one; and
color filters located in the fourth opening areas.

In some embodiments, in a direction in which the first base substrate points to the color filters, cross-sectional areas of the fourth opening areas in a direction parallel to a plane where the first base substrate is located increase sequentially, and a width of the fourth opening area on a side away from the first base substrate is greater than a width of the second opening area.

Embodiments of the disclosure provide a manufacturing method for a display panel, including:
providing a first base substrate including a plurality of sub-pixel areas;
forming a plurality of first light-emitting devices, a first dam layer and a plurality of first photoluminescent layers sequentially on a side of the first base substrate; where the first light-emitting devices correspond to the sub-pixel areas one by one, the first dam layer includes first opening areas corresponding to the sub-pixel areas one by one, and the first photoluminescent layers are in at least part of the first opening areas; and
forming a plurality of second light-emitting devices, a second dam layer and a plurality of second photoluminescent layers on a side of the first photoluminescent layers away from the first base substrate; where orthographic projections of the second light-emitting devices on the first base substrate do not overlap with the sub-pixel areas; the second dam layer and the plurality of second photoluminescent layers are on a side of the second light-emitting devices away from the first base substrate, the second dam layer includes second opening areas corresponding to the sub-pixel areas one by one, and the second photoluminescent layers are in at least part of the second opening areas.

In some embodiments, forming the plurality of second light-emitting devices, the second dam layer and the plurality of second photoluminescent layers on the side of the first photoluminescent layers away from the first base substrate, specifically includes:
providing a second base substrate;
forming the plurality of second light-emitting devices and a first pixel definition layer on a side of the second base substrate; where the first pixel definition layer includes third opening areas corresponding to the second light-emitting devices one by one; the first pixel definition layer includes a first light transmissive material; orthographic projections of the third opening areas on the first base substrate do not overlap with the sub-pixel areas, and the second light-emitting devices are arranged in the third opening areas;

forming the second dam layer on a side of the second base substrate away from the second light-emitting devices, and forming the second opening areas in the second dam layer using a patterning process;

forming the second photoluminescent layers in at least part of the second opening areas; and bonding the side of the second base substrate where the second light-emitting devices are arranged to the side of the first photoluminescent layers away from the first base substrate.

In some embodiments, forming the plurality of second light-emitting devices and the first pixel definition layer on the side of the second base substrate, includes:

forming a pattern of second anodes on the side of the second base substrate;

forming the first pixel definition layer on a side of the second anodes away from the second base substrate, and forming the third opening areas that expose the second anodes in the first pixel definition layer;

forming a pattern of second light-emitting layers in the third opening areas and on the side of the second anodes away from the second base substrate; and forming second cathodes on a side of the second light-emitting layers away from the second anodes.

In some embodiments, when forming the third opening areas that expose the second anodes in the first pixel definition layer, the method further includes:

forming a plurality of first via holes penetrating a thickness of the first pixel definition layer; where orthographic projections of the third opening areas on the second base substrate fall into areas surrounded by orthographic projections of the first via holes on the second base substrate, and the orthographic projections of the first via holes on the second base substrate do not overlap with orthographic projections of the sub-pixel areas on the second base substrate; and filling the first via holes with first reflective parts.

In some embodiments, forming the first pixel definition layer on the side of the second anode away from the second base substrate, and forming the third opening areas that expose the second anodes in the first pixel definition layer, includes:

depositing a first light transmissive material on the side of the second anode away from the second base substrate to form a first light transmissive material layer, and performing a patterning process on the first light transmissive material layer to form a plurality of five opening areas; and depositing a first refractive index material in the fifth opening areas, and performing a patterning process on the first refractive index material to form first reflective parts and the third opening areas; where orthographic projections of the third opening areas on the second base substrate fall into areas surrounded by orthographic projections of the first reflective parts on the second base substrate, and the orthographic projections of the first reflective parts on the second base substrate do not overlap with orthographic projections of the sub-pixel areas on the second base substrate.

In some embodiments, forming the second dam layer on the side of the second base substrate away from the second light-emitting devices, includes:

forming a pattern of a first light transmissive part on the side of the second base substrate away from the second light-emitting devices; and forming a pattern of a second reflective part on a side of the first light transmissive part away from the second base substrate.

In some embodiments, before forming the second dam layer on the side of the second base substrate away from the second light-emitting devices, the method further includes:

forming a first filling layer on the side of the second base substrate away from the second light-emitting devices; where a refractive index of the first filling layer is less than a refractive index of the second photoluminescent layer.

In some embodiments, the sub-pixel areas include: a red sub-pixel area, a green sub-pixel area and a blue sub-pixel area; the first light-emitting devices and the second light-emitting devices are all blue light-emitting devices; and forming the second photoluminescent layers in at least part of the second opening areas includes:

forming a second red photoluminescent layer in the second opening area corresponding to the red sub-pixel area, and forming a second green photoluminescent layer in the second opening area corresponding to the green sub-pixel area.

In some embodiments, before forming the second dam layer on the side of the second base substrate away from the second light-emitting devices, the method further includes:

forming a refractive layer on the side of the second base substrate away from the second light-emitting devices, and using a nanoimprint process for a surface of the refractive layer away from the second base substrate in an area corresponding to the blue sub-pixel area to form a lens structure.

In some embodiments, after forming the second photoluminescent layers in at least part of the second opening areas, the method further includes:

forming a first light-shielding layer on a side of the second photoluminescent layers away from the second base substrate, and performing a patterning process on the first light-shielding layer to form fourth opening areas corresponding to the sub-pixel areas one by one; and forming color filters in the fourth opening areas.

Embodiments of the disclosure provide a display device, including the display panel provided by the embodiments of the disclosure.

Embodiments of the disclosure provide a driving method for a display device, including:

driving the first light-emitting devices and the second light-emitting devices to emit light in a first display mode.

In some embodiments, the method further includes:

driving the first light-emitting devices or the second light-emitting devices to emit light in a second display mode.

In some embodiments, the method further includes:

driving the first light-emitting devices and the second light-emitting devices to emit light alternately in a third display mode.

BRIEF DESCRIPTION OF FIGURES

In order to illustrate the technical solutions in the embodiments of the disclosure more clearly, the accompanying figures which need to be used in describing the embodiments will be introduced below briefly. Obviously the accompanying figures described below are only some embodiments of the disclosure, and other accompanying figures can also be obtained by those ordinary skilled in the art according to these accompanying figures without creative labor.

DETAILED DESCRIPTION

Figure 1:
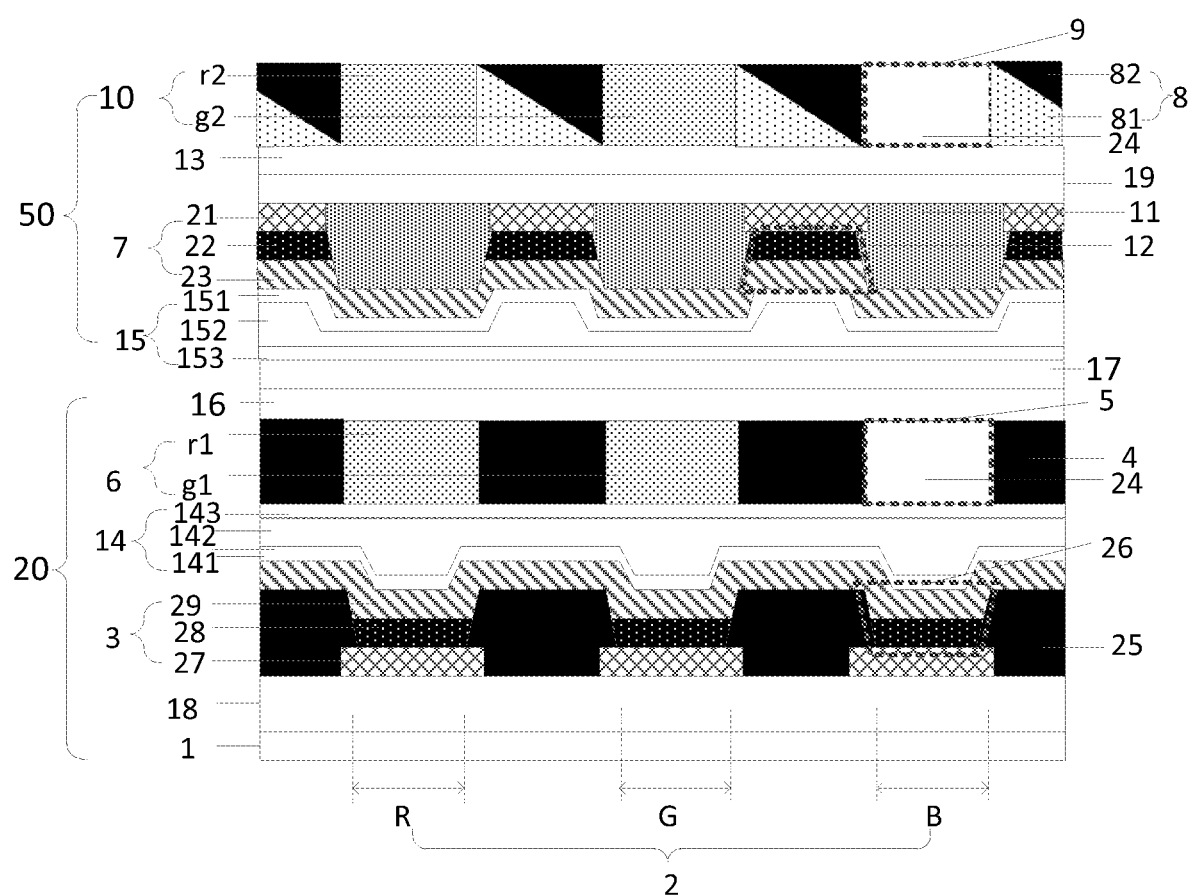
FIG. 1 is a structural schematic diagram of a display panel according to an embodiment of the disclosure.

In order to make the purposes, technical solutions and advantages of the disclosure clearer, the technical solutions of the embodiments of the disclosure will be described clearly and completely below in combination with the accompanying figures of the embodiments of the disclosure. Obviously the described embodiments are a part of the embodiments of the disclosure but not all the embodiments. Also in the case of no conflict, the embodiments and the features therein in the disclosure can be combined with each other. Based upon the embodiments of the disclosure, all of other embodiments obtained by those ordinary skilled in the art without creative work pertain to the protection scope of the disclosure.

Unless otherwise defined, the technical or scientific terms used in the disclosure shall have the general meaning understood by those ordinary skilled in the art to which the disclosure belongs. The "first", "second" and similar words used in the disclosure do not represent any order, quantity or importance, and are only used to distinguish different components. The word such as "include" or "contain" or the like means that the element or object appearing before this word encompasses the elements or objects and their equivalents listed after this word, without excluding other elements or objects. The word such as "connect" or "connected" or the like is not limited to the physical or mechanical connection, but can include the electrical connection, whether direct or indirect.

It is necessary to note that the size and shape of each diagram in the accompanying figures do not reflect the true proportion, and are merely for purpose of schematically illustrating the content of the disclosure. Also, the same or similar reference numbers represent the same or similar elements or the elements having the same or similar functions all the way.

Embodiments of the disclosure provide a display panel, including:

a first base substrate 1 including a plurality of sub-pixel areas 2;

a plurality of first light-emitting devices 3 located on a side of the first base substrate 1 and corresponding to the sub-pixel areas 2 one by one;

a first dam layer 4 located on a side of the first light-emitting devices 3 away from the first base substrate 1 and including first opening areas 5 corresponding to the sub-pixel areas 2 one by one;

a plurality of first photoluminescent layers 6 located on a side of the first light-emitting devices 3 away from the first base substrate 1 and located in at least part of the first opening areas 5;

a plurality of second light-emitting devices 7 located on a side of the first dam layer 4 away from the first light-emitting devices 3, orthographic projections of the second light-emitting devices 7 on the first base substrate 1 not overlapping with the sub-pixel areas 2;

a second dam layer 8 located on a side of the second light-emitting devices 7 away from the first base substrate 1 and including second opening areas 9 corresponding to the sub-pixel areas 2 one by one; and a plurality of second photoluminescent layers 10 located on a side of the second light-emitting devices 7 away from the first base substrate 1 and located in at least part of the second opening areas 9.

The display panel provided by the embodiments of the disclosure includes double-layer light-emitting devices and double-layer photoluminescence layers that are alternately arranged, so that lights from the double-layer light-emitting devices are color-converted through different photoluminescent layers respectively and are superimposed, thus improving the light extraction rate of the display panel, and also improving the light emission luminance and contrast of the display device. Also, the light emitted by the first light-emitting devices but not utilized by the first photoluminescent layers may be used again when reaching the second photoluminescent layers, thus improving the light utilization rate of the first light-emitting devices. Moreover, the first light-emitting devices are in the first openings corresponding to the sub-pixel areas, and the orthographic projections of the second light-emitting devices on the first base substrate do not overlap with the sub-pixel areas, that is, the orthographic projections of the first light-emitting devices and the second light-emitting devices on the first base substrate are spaced apart from each other, to avoid the second light-emitting devices from affecting the light extraction rate of the first light-emitting devices.

Figure 2:
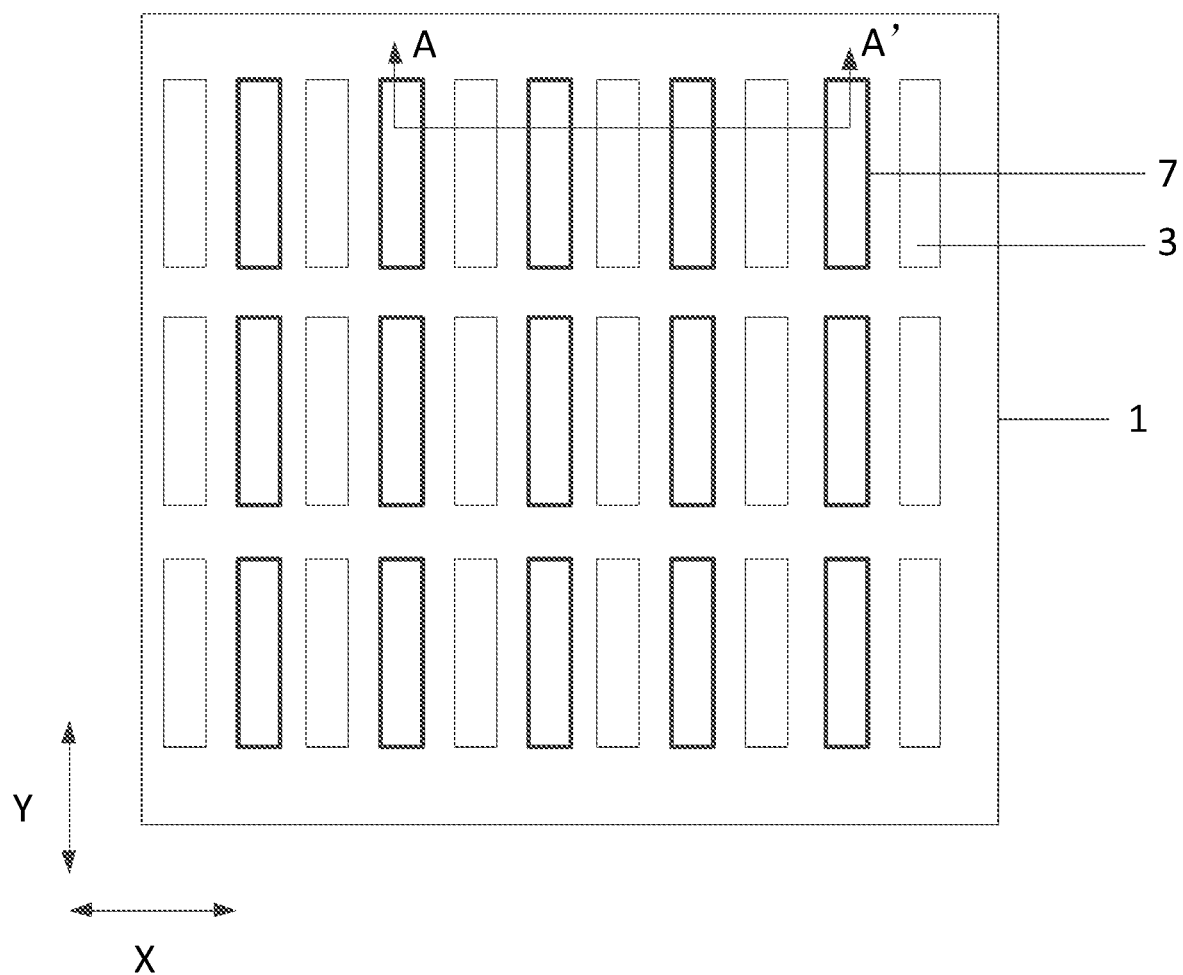
FIG. 2 is a schematic diagram of orthographic projections of the first light-emitting device and the second light-emitting device on the first base substrate in the display panel according to an embodiment of the disclosure.

In some implementations, the orthographic projections of the first light-emitting devices and the second light-emitting devices on the first base substrate are as shown in FIG. 2. The first light-emitting devices 3 and the second light-emitting devices 7 are both arranged in array in the first direction X and the second direction Y. The first direction X intersects the second direction Y. In FIG. 2, the first direction X is perpendicular to the second direction Y; the widths of the first light-emitting devices 3 and the second light-emitting devices 7 in the first direction X are less than the widths of the first light-emitting devices 3 and the second light-emitting devices 7 in the second direction Y respectively; and the second light-emitting device 7 is located between two adjacent first light-emitting devices 3 only in the first direction X. FIG. 1 may be, for example, a cross-sectional view along AA' in FIG. 2.

In some embodiments, as shown in FIG. 1, the display panel further includes: a second base substrate 13 located between the second light-emitting devices 7 and the second photoluminescent layers 10.

In some implementations, the second light-emitting devices and the second photoluminescent layers are respectively formed on two sides of the second base substrate.

It should be noted that, as shown in FIG. 1, the display panel provided by the embodiments of the disclosure includes a first display substrate 20 and a second display substrate 50. The first display substrate 20 includes: the first base substrate 1, the first light-emitting devices 3, the first dam layer 4 and the first photoluminescence layers 6. The second display substrate 50 includes: the second base substrate 13, the second light-emitting devices 7, the second dam layer 8 and the second photoluminescence layers 10. The first display substrate and the second display substrate are manufactured independently, and then the display panel is formed through the box-aligning process, so that it is easy to manufacture the display panel including double-layer light-emitting devices and double-layer photoluminescent layers.

In some embodiments, as shown in FIG. 1, the display panel further includes:
a first encapsulation layer 14 located between the first light-emitting devices 3 and the first photoluminescent layers 6;
a second encapsulation layer 15 located between the second light-emitting devices 7 and the first photoluminescent layers 6;
a first covering layer 16 located between the first photoluminescent layers 6 and the second encapsulation layer 15; and
a first light transmissive adhesive layer 17 located between the second encapsulating layer 15 and the first covering layer 16.

That is, the first display substrate further includes: the first encapsulation layer and the first covering layer. The second display substrate further includes: the second encapsulation layer. The first encapsulation layer is used to encapsulate the first light-emitting devices to prevent the first light-emitting devices from being corroded by water and oxygen. The second encapsulation layer is used to encapsulate the second light-emitting devices to prevent the second light-emitting devices from being corroded by water and oxygen. The first covering layer is used to protect the first photoluminescent layers. The first light transmissive adhesive layer is used to bond the first display substrate and the second display substrate.

In some embodiments, as shown in FIG. 1, the first encapsulation layer 14 and the second encapsulation layer 15 each include: a first inorganic encapsulation film 141/151, an organic encapsulation film 142/152 and a second inorganic encapsulation film 143/153 that are stacked.

In some embodiments, the material of the first light transmissive adhesive layer includes optical glue. The transmittance of the optical glue included in the first light transmissive adhesive layer is greater than or equal to 95%, so as to prevent the transmittance of the first light transmissive adhesive layer from affecting the light extraction rate of the first display substrate.

In some implementations, the light-emitting device is an electroluminescent device. The electroluminescent device is, for example, an Organic Light-Emitting Diode (OLED). Alternatively, the electroluminescent device may also be Micro LED, Mini LED or any other light-emitting device. In the following, the embodiments of the disclosure will be described by taking the light-emitting device as an OLED as an example.

In some embodiments, as shown in FIG. 1, the first light-emitting device 3 includes: a first anode 27, a first light-emitting layer 28, and a first cathode 29 stacked on a side of the first base substrate 1.

The display panel further includes:
a first pixel definition layer 11 located between the first photoluminescence layers 6 and the second photoluminescence layers 10 and including third opening areas 12 corresponding to the second light-emitting devices 7 one by one.

The first pixel definition layer 11 includes a first light transmissive material. Orthographic projections of the third opening areas 12 on the first base substrate 1 do not overlap with the sub-pixel areas 2, and the second light-emitting devices 7 are arranged in the third opening areas 12.

In some implementations, the light emitting areas of the second light-emitting devices are defined by forming the third opening areas in the first pixel definition layer. The orthographic projections of the third opening areas on the first base substrate do not overlap with the sub-pixel areas. That is, the orthographic projection of the first pixel definition layer on the first base substrate overlaps with the sub-pixel areas, and the orthographic projection of the first pixel definition layer on the first base substrate overlaps with the orthographic projections of the first opening areas on the first base substrate. The first pixel definition layer includes a first light transmissive material, that is, the first pixel definition layer is a light transmissive film layer, thus avoiding the first pixel definition layer from affecting the light extraction rate of the first display substrate.

In some embodiments, the first pixel definition layer 11 has a transmittance greater than or equal to 80% for light with a wavelength greater than or equal to 380 nanometers and less than or equal to 780 nanometers. That is, the first pixel definition layer can transmit the visible light and has a high transmittance for the visible light, so that all the light emitted from the first display substrate can pass through the first pixel definition layer, avoiding the first pixel definition layer from affecting the light extraction of the first display substrate, and avoiding the effect on the normal display of the display panel.

In some embodiments, as shown in FIG. 1, the second light-emitting device 7 includes:
a second anode 21 located on a side of the second base substrate 13 away from the second photoluminescence layers 10; here an orthographic projection of the third opening area 12 on the second base substrate 13 falls into an orthographic projection of the second anode 21 on the second base substrate 13; and the second anode 21 is a light transmissive electrode;
a second light-emitting layer 22 located on a side of the second anode 21 facing the first dam layer 4 in the third opening area 12; and
a second cathode 23 located on a side of the second light-emitting layer 22 away from the second anode 21.

In the display panel provided by the embodiments of the disclosure, the second anode is located between the second photoluminescent layer and the second cathode, that is, the second light-emitting device is a bottom-emitting device. The bottom-emitting device can achieve the total reflection effect of the light path at the second cathode and improve the light extraction rate of the second light-emitting device.

In some implementations, the second cathode may be, for example, a thicker metal layer. The material of the second cathode may include, for example, silver or aluminum. The thickness of the second cathode may be, for example, greater than or equal to 800 angstroms and less than or equal to 1200 angstroms. The second anode includes, for example, Indium Tin Oxide (ITO), and the thickness of the second anode may be, for example, 1000 angstroms.

In some embodiments, as shown in FIG. 1, the display panel further includes driving circuit layers. Specifically, the driving circuit layers include: a first driving circuit layer 18 located between the first base substrate 1 and the first light-emitting devices 3, and a second driving circuit layer 19 located between the second base substrate 13 and the second anodes 21. The first driving circuit layer is electrically connected to the first light-emitting devices to drive the first light-emitting devices to emit light. The second driving circuit layer is electrically connected to the second light-emitting devices to drive the second light-emitting devices to emit light. That is, in the embodiments of the disclosure, the first driving circuit layer and the second driving circuit layer can respectively drive the first light-emitting devices and the second light-emitting devices to emit light. Therefore, the display panel provided by the embodiments of the disclosure can also implement multiple display modes: for example, the first light-emitting devices and the second light-emitting devices can emit light at the same time, or the first light-emitting devices and the second light-emitting devices can emit light alternately, or only one of the first light-emitting devices and the second light-emitting devices can emit light; thereby increasing the application scenarios of the display panel.

In some embodiments, as shown in FIG. 1, the second anodes 21 are located between the first pixel definition layer 11 and the second driving circuit layer 19. The first pixel definition layer 11 covers the edges of the second anodes 21. The second cathodes 23 corresponding to the plurality of sub-pixels areas 2 are integrally connected. It should be noted that the plurality of second cathodes are integrally connected, but the actual area of the second light-emitting device is only the area in which the second anode, the second light-emitting layer and the second cathode are stacked. The orthographic projection of the second light-emitting device on the first base substrate refer to the overlapping area of the orthographic projections of the second anode, the second light-emitting layer and the second cathode on the first base substrate. The orthographic projection of the second light-emitting device on the first base substrate does not overlap with the sub-pixel area, that is, the overlapping area of the orthographic projections of the second anode, the second light-emitting layer and the second cathode on the first base substrate does not overlap with the sub-pixel area.

In some embodiments, as shown in FIG. 1, the display panel further includes a second pixel definition layer 25 that includes sixth opening areas 26 corresponding to the sub-pixel areas one by one. The first anode 27, the first light-emitting layer 28 and the first cathode 29 included in the first light-emitting device 3 are stacked in sequence in the sixth opening area 26. Here, the first anodes 27 are located between the second pixel definition layer 25 and the first driving circuit layer 18. The second pixel definition layer 25 covers the edges of the first anodes 27. The first cathodes 29 corresponding to the plurality of sub-pixel areas 2 are integrally connected. It should be noted that the plurality of first cathodes are integrally connected, but the actual area of the first light-emitting device is only the area in which the first anode, the first light-emitting layer and the first cathode are stacked. The orthographic projection of the first light-emitting device on the first base substrate refer to the overlapping area of the orthographic projections of the first anode, the first light-emitting layer and the first cathode on the first base substrate.

In some implementations, the first light-emitting device is a top-emitting device. The first anode may include, for example, stacked layers of titanium/aluminum/titanium. The thickness of the titanium layer may be, for example, 70 Angstroms. The thickness of the aluminum layer may be, for example, 100 Angstroms. The first cathode may include, for example, magnesium or silver. The thickness of the first cathode may be, for example, 130 angstroms.

Figure 3:
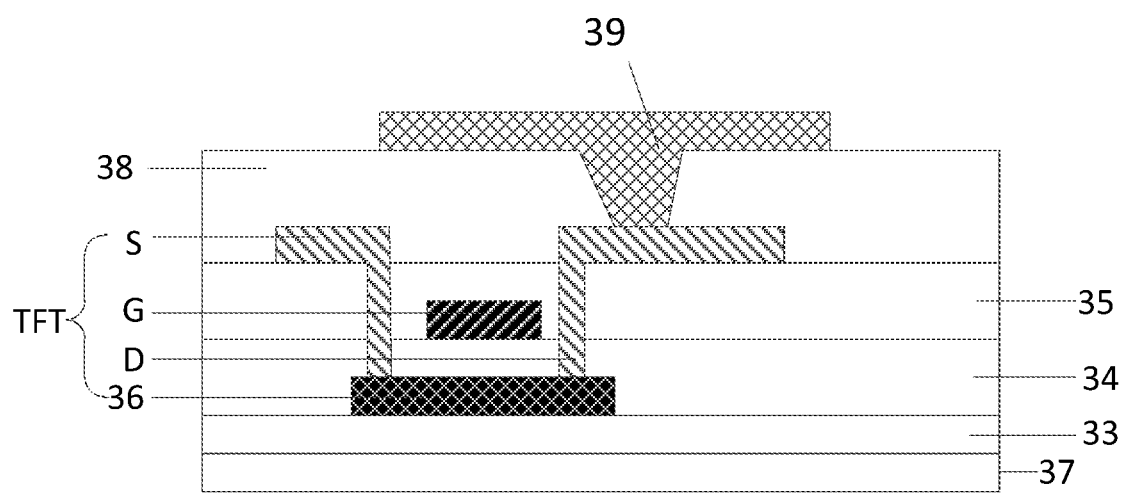
FIG. 3 is a structural schematic diagram of a driving circuit layer according to an embodiment of the disclosure.

In some implementations, the driving circuit layer includes a plurality of pixel driving circuits arranged in an array. The pixel driving circuits are used to drive the light-emitting devices to emit light. The pixel driving circuit includes a thin film transistor TFT and a storage capacitor (not shown). As shown in FIG. 3, the thin film transistor TFT includes: an active layer 36, a gate G, a source S and a drain D. In FIG. 3, the thin film transistor TFT is a top gate structure as an example for illustration. Of course, the thin film transistor TFT can also be a bottom gate structure or other structure. As shown in FIG. 3, the driving circuit layer further includes: a buffer layer 33 located between the active layer 36 and the base substrate 37, a first gate insulating layer 34 located between the active layer 36 and the gate G, an interlayer insulating layer 35 between the source S and the drain D, and a planarization layer 38 between the light-emitting device and the source S and drain D. The anode 39 is connected to the drain D through a via hole penetrating the planarization layer 38. It should be noted that, if the drive circuit layer is the first drive circuit layer, the base substrate 37 is the first base substrate 1, and the anode is the first anode 27; if the drive circuit layer is the second drive circuit layer, the base substrate 37 is the second base substrate 13, and the anode is the second anode 21.

In some implementations, the first light-emitting device and the second light-emitting device may also include an electron injection layer, an electron transport layer, a hole transport layer, a hole injection layer, etc.

In some embodiments, as shown in FIG. 1, the cross-sectional area of the third opening area 12 in a direction parallel to a plane where the second base substrate 13 is located gradually decreases in a direction in which the first base substrate 1 points to the second base substrate 13.

That is, the shape of the cross section of the first pixel definition layer in the direction perpendicular to the plane where the second base substrate is located is roughly an inverted trapezoid. The cross-sectional area of the partial region of the first pixel definition layer close to the first base substrate in the direction parallel to the plane where the second base substrate is located gradually increases in a direction in which the first base substrate 1 points to the second base substrate 13. Since the orthographic projection of the first pixel definition layer on the first base substrate overlaps with the orthographic projection of the first photoluminescence layer on the base substrate, the roughly inverted trapezoid shape of the cross section of the first pixel definition layer in the direction perpendicular to the plane where the second base substrate is located can ensure the light extraction rate of the first photoluminescence layer.

In some embodiments, the orthographic projection of the first opening area on the base substrate coincides with the sub-pixel area, and the shape of the cross section of the first opening area in the direction perpendicular to the plane where the first base substrate is located is a rectangle. When the shape of the cross section of the first pixel definition layer in the direction perpendicular to the plane where the second base substrate is located is roughly an inverted trapezoid, since the orthographic projection of the third opening area on the first base substrate does not overlap with the sub-pixel area, the width of the cross section of the first pixel definition layer in the direction perpendicular to the plane where the second base substrate is located close to the first base substrate is not less than the width of the first opening area, and the width of the cross section of the first pixel definition layer in the direction perpendicular to the plane where the second base substrate is located close to the second base substrate is greater than the width of the first opening area.

In some embodiments, as shown in FIGS. 4 to 7, the first pixel definition layer 11 includes a plurality of first reflective parts 46 corresponding to the third opening areas 12 one by one.

The orthographic projections of the third opening areas 12 on the second base substrate 13 fall into areas surrounded by the orthographic projections of the first reflective parts 46 on the second base substrate 13. The orthographic projections of the first reflective parts 46 on the second base substrate 13 do not overlap with the orthographic projections of the sub-pixel areas 2 on the second base substrate 13.

Figure 4:
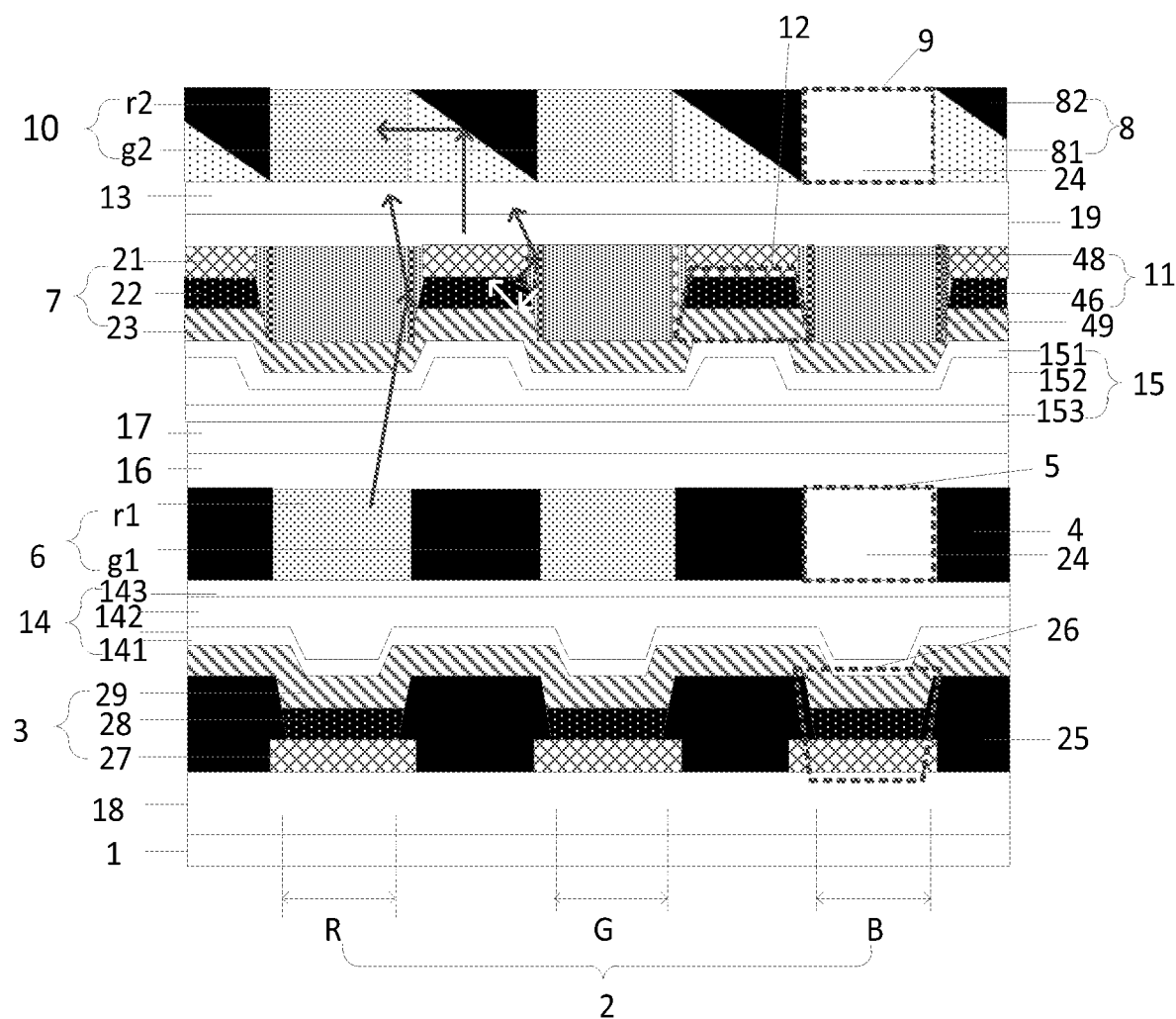
FIG. 4 is a structural schematic diagram of another display panel according to an embodiment of the disclosure.
Figure 6:
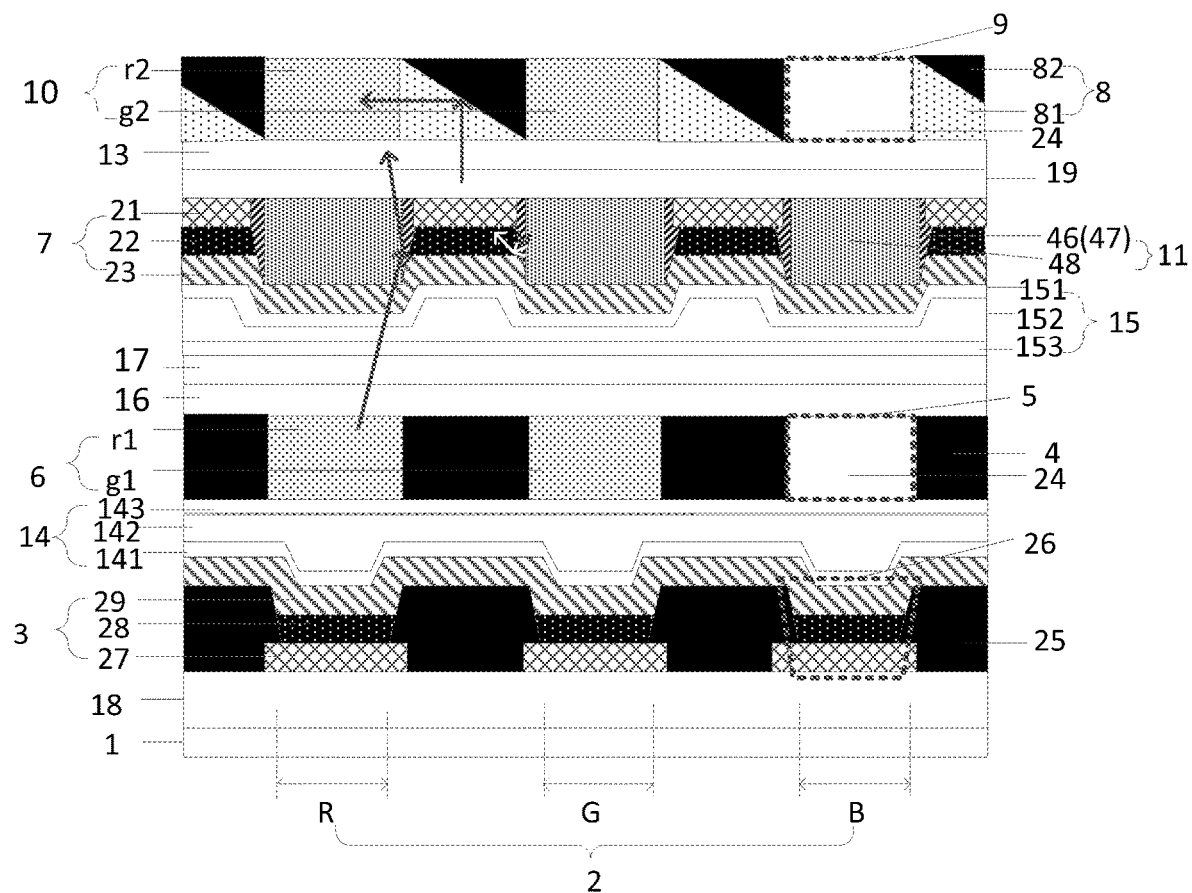
FIG. 6 is a structural schematic diagram of yet another display panel according to an embodiment of the disclosure.

In some implementations, as shown in FIGS. 4 and 6, the first pixel definition layer 11 is divided into first reflective parts 46 and second light transmissive parts 48. The second light transmissive part 48 includes the first light transmissive material.

In the display panel provided by the embodiments of the disclosure, the first pixel definition layer includes the first reflective parts. The orthographic projections of the third opening areas on the second base substrate fall into the areas surrounded by the orthographic projections of the first reflective parts on the second base substrate, so that the orthographic projections of the second light-emitting devices on the second base substrate fall into the areas surrounded by the orthographic projections of the first reflective parts on the second base substrate. That is, the first reflective parts surround the second light-emitting devices. The light emitted by the second light-emitting devices can be reflected when reaching the first reflective parts. Compared with the case where only the second light transmissive part including the first light transmissive material is arranged, the crosstalk of the light emitted by the second light-emitting device in the direction parallel to the plane where the second base substrate is located can be avoided, and the light extraction rate of the front of the second light-emitting device can also be improved. In addition, the light emitted from the first display substrate may also be reflected when reaching the first reflective part, and the optical path of the light emitted from the first display substrate may be corrected, so that the light with a larger angle relative to the direction perpendicular to the first base substrate is reflected after reaching the first reflective part, and may subsequently be incident to the second photoluminescent layer. In this way, the light emitted by the first light-emitting devices but not utilized by the first photoluminescent layers can be used again when reaching the second photoluminescent layers, thus improving the light utilization rate of the first light-emitting devices.

In some embodiments, as shown in FIGS. 4 and 6, the maximum thickness of the first reflective part 46 in the direction perpendicular to the first base substrate 1 is equal to the maximum thickness of the second light transmissive part 48 in the direction perpendicular to the first base substrate 1, so as to ensure that the light emitted by the second light-emitting device toward the side of the third opening area reaches the first reflective part as much as possible and is thus totally reflected.

In some embodiments, as shown in FIG. 4, the first pixel definition layer 11 includes first via holes 49 penetrating in the thickness direction thereof, and the first reflective parts 46 are filled in the first via holes 49.

In some embodiments, as shown in FIG. 4, the first reflective part 46 includes a reflective metal material.

As shown in FIGS. 4 and 6, the orthographic projection of the first reflective part 46 on the second base substrate 13 does not overlap with the orthographic projection of the second anode on the second base substrate 13.

The first reflective part 46 is in contact with the second cathode 23.

In the display panel provided by the embodiments of the disclosure, the first reflective part is the reflective metal material filled in the first via hole. The light emitted by the second light-emitting device toward the side of the third opening area can be reflected when reaching the first reflective part, avoiding the crosstalk of the light emitted by the second light-emitting device in the direction parallel to the plane where the second base substrate is located, and also improving the light extraction rate of the front of the second light-emitting device. The light emitted from the first display substrate can also be reflected when reaching the first reflective part. The light emitted by the first light-emitting devices but not utilized by the first photoluminescent layers can be used again when reaching the second photoluminescent layers, thus improving the light utilization rate of the first light-emitting devices. Also, the first reflective part including the metal material is also in contact with the second cathode, that is, the first reflective part may also serve as an auxiliary cathode electrically connected to the second cathode, thereby reducing the impedance of the second cathode. In addition, the orthographic projection of the first reflective part on the second base substrate does not overlap with the orthographic projection of the second anode on the second base substrate, thus avoiding a short circuit between the second cathode and the second anode.

Figure 5:
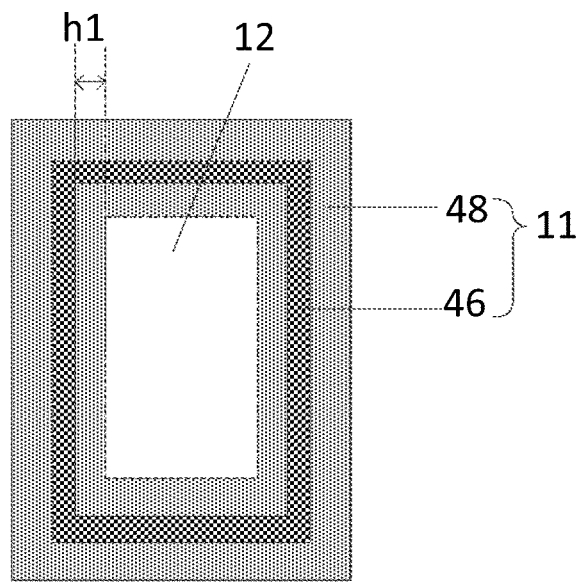
FIG. 5 is a schematic diagram of a relationship between orthographic projections of the first reflection part and the third opening area according to an embodiment of the disclosure.

In some embodiments, as shown in FIG. 5, the distance h1 between the orthographic projection of the first reflective part 46 on the second base substrate and the orthographic projection of the third opening area 12 on the base substrate is greater than or equal to 1 micron and less than or equal to 2 micron.

Alternatively, in some embodiments, as shown in FIG. 6, the first reflective part 46 includes a first refractive index material 47. The refractive index of the second light-emitting layer 22 is greater than the refractive index of the first refractive index material 47.

That is, the light emitted by the second light-emitting device is incident from the second light-emitting layer to the first reflective part and may be totally reflected on the interface between the second light-emitting layer and the first refractive index material, thus avoiding the crosstalk of the light emitted by the second light-emitting device in the direction parallel to the second base substrate, and also improving the light extraction rate of the front of the second light-emitting device.

In some embodiments, a refractive index of the first light transmissive material is greater than the refractive index of the first refractive index material. That is, the total reflection may occur when the light passes through the second light transmissive part and reaches the interface between the second light transmissive part and the first reflective part. That is, the light emitted from the first display substrate may be totally reflected when reaching the interface between the second light-emitting layer and the first refractive index material.

The light emitted by the first light-emitting devices but not utilized by the first photoluminescent layers can be used again when reaching the second photoluminescent layers, thus improving the light utilization rate of the first light-emitting devices.

Figure 7:
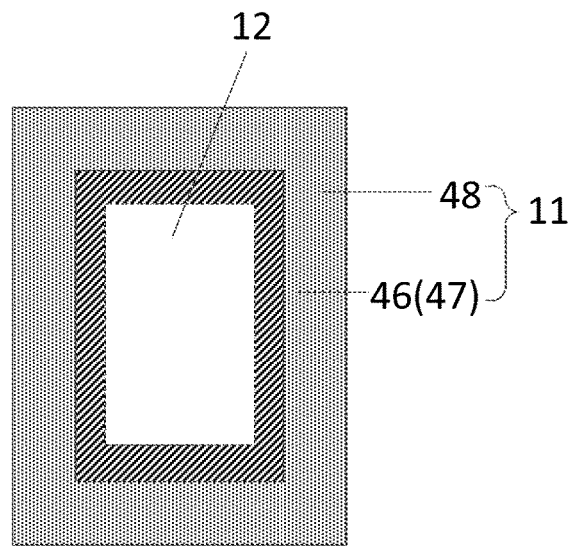
FIG. 7 is a schematic diagram of another relationship between orthographic projections of the first reflection part and the third opening area according to an embodiment of the disclosure.

In some embodiments, as shown in FIGS. 6 and 7, the first reflective part 46 surrounds the third opening area 12, so that the light-emitting layer of the second light-emitting device is in contact with the first reflective part, and the light emitted by the second light-emitting device toward the side of the third opening area can be totally reflected when reaching the interface between the second light-emitting layer and the first refractive index material, avoiding the crosstalk of the light emitted by the second light-emitting device in the direction parallel to the plane where the second base substrate is located, and also improving the light extraction rate of the front of the second light-emitting device.

In some embodiments, as shown in FIGS. 1, 4, 6, 8 and 9, the second dam layer 8 includes: a first light transmissive part 81 and a second reflective part 82 on a side of the first light transmissive part 81 away from the first base substrate 1. The first light transmissive part 81 only transmits light emitted by the second light-emitting devices 7. The refractive index of the first light transmissive part 81 is greater than the refractive index of the second reflective part 82. An angle between at least part of an interface between the first light transmissive part 81 and the second reflective part 82 and the direction perpendicular to the plane where the first base substrate 1 is located is greater than 0 and less than 90°.

The orthographic projection of the second reflective part 82 on the first base substrate 1 covers the orthographic projection of the first light transmissive part 81 on the first base substrate 1.

In the display panel provided by the embodiments of the disclosure, the second dam layer includes the first light transmissive part and the second reflective part. The angle between at least part of the interface between the first light transmissive part and the second reflective part and the direction perpendicular to the plane where the first base substrate 1 is located is greater than 0 and less than 90°. That is, the interface between the first light transmissive part and the second reflective part has an angle relative to the vertical direction. Thus, when the first light transmissive part only transmits the light emitted by the second light-emitting devices and the refractive index of the first light transmissive part is greater than the refractive index of the second reflective part, the light emitted by the second light-emitting devices is reflected when reaching the interface between the first light transmissive part and the second reflective part, and the reflected light is incident toward the side of the second photoluminescent layers, so that the light emitted by the second light-emitting devices can be utilized by the second photoluminescent layers to perform color conversion. Moreover, compared with the case where the second dam layer includes only the first light transmissive part, the crosstalk between the second electroluminescent layers corresponding to adjacent sub-pixel areas can also be avoided.

In some embodiments, the second reflective part includes a reflective metal material.

Alternatively, in some embodiments, the second reflective part may also include other non-metallic materials, but the refractive index of the material included in the second reflective part is less than the refractive index of the first light transmissive part, so that the light passing through the first light transmissive part can be totally reflected at the interface between the second reflective part and the first light transmissive part.

In some embodiments, as shown in FIG. 1, the cross section of the second dam layer 8 is a rectangle, and the cross sections of the first light transmissive part 81 and the second reflective part 82 are both right triangles, in the direction perpendicular to the first base substrate 1.

Figure 8:
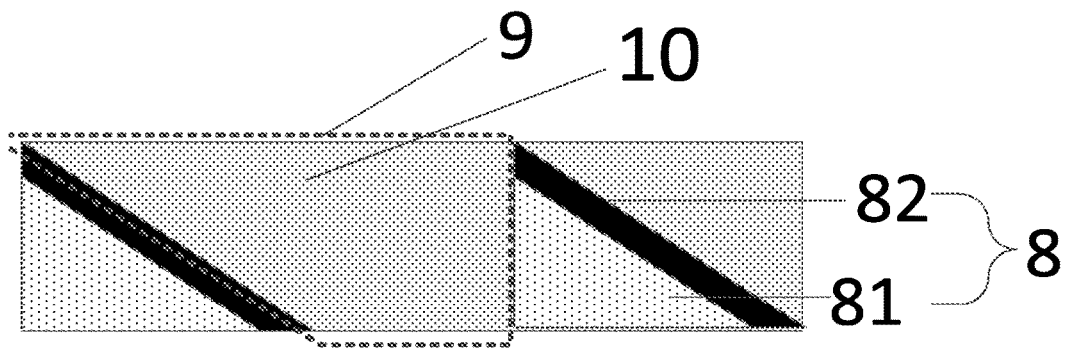
FIG. 8 is a structural schematic diagram of a second dam layer according to an embodiment of the disclosure.

In some embodiments, as shown in FIG. 8, the cross section of the second dam layer 8 is a triangle, and the cross section of the first light transmissive part 81 is a triangle, in the direction perpendicular to the first base substrate 1.

In some embodiments, the cross section of the second dam layer 8 is a trapezoid, and the cross section of the first light transmissive part 81 is a trapezoid, in the direction perpendicular to the first base substrate.

Figure 9:
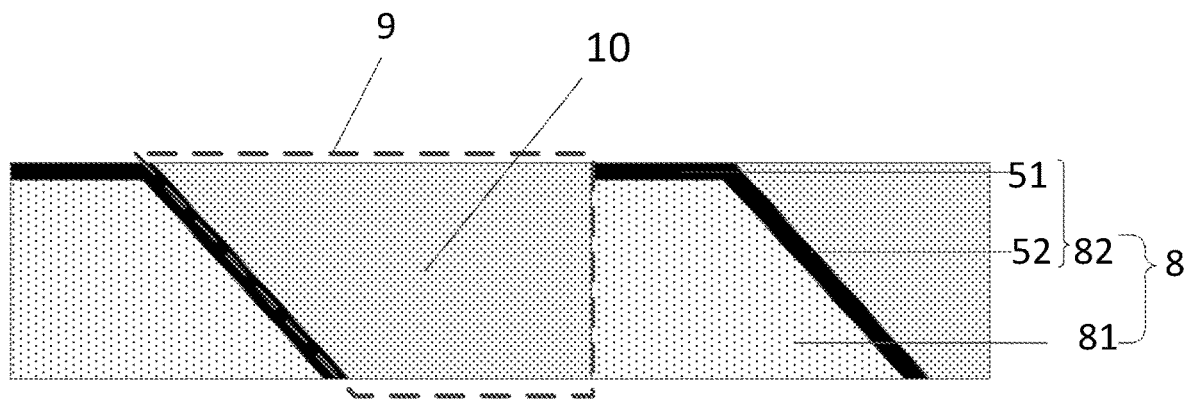
FIG. 9 is a structural schematic diagram of another second dam layer according to an embodiment of the disclosure.

In some embodiments, as shown in FIG. 9, the cross section of the second dam layer 8 and the cross section of the first light transmissive part 81 are right-angled trapezoids in the direction perpendicular to the first base substrate.

In some implementations, when the shape of the cross section of the second dam layer in the direction perpendicular to the first base substrate is a non-rectangle such as triangle or trapezoid, the shape of the cross section of the second opening area in the direction perpendicular to the first base substrate is also a non-rectangle. Compared with the case where the cross-section is rectangular, the area of the second opening area can be increased, thereby increasing the aperture ratio of the second photoluminescent layer, increasing the content of the electroluminescent material in the second photoluminescent layer per unit volume, and thus improving the light-emission rate of the second photoluminescent layer.

In some embodiments, as shown in FIGS. 8 and 9, the cross-sectional area of the first light transmissive part 81 is less than the cross-sectional area of the second dam layer 8, and the cross section of the first light transmissive part 81 and the cross section of the second dam layer 8 are similar in shape.

That is, the second reflective part has the same thickness at different positions. As shown in FIG. 8, when the cross section of the first light transmissive part 81 is a right-angled triangle in the direction perpendicular to the first base substrate, the second reflective part 82 has the same thickness in the direction perpendicular to the inclined surface of the right-angled triangle. As shown in FIG. 9, when the cross section of the first light transmissive part 81 is a right-angled trapezoid in the direction perpendicular to the first base substrate, the second reflective part is divided into a first part 51 covering the surface of the first light transmissive part 81 parallel to the first base substrate 1 and a second part 52 covering the inclined surface of the first light transmissive part 81. The first part 51 has the same thickness in the direction perpendicular to the first base substrate. The second part 52 has the same thickness in the direction perpendicular to the inclined surface of the first light transmissive part 81. The thickness of the first part 51 in the direction perpendicular to the first base substrate is equal to the thickness of the second part 52 in the direction perpendicular to the inclined surface of the first light transmissive part 81.

Figure 10:
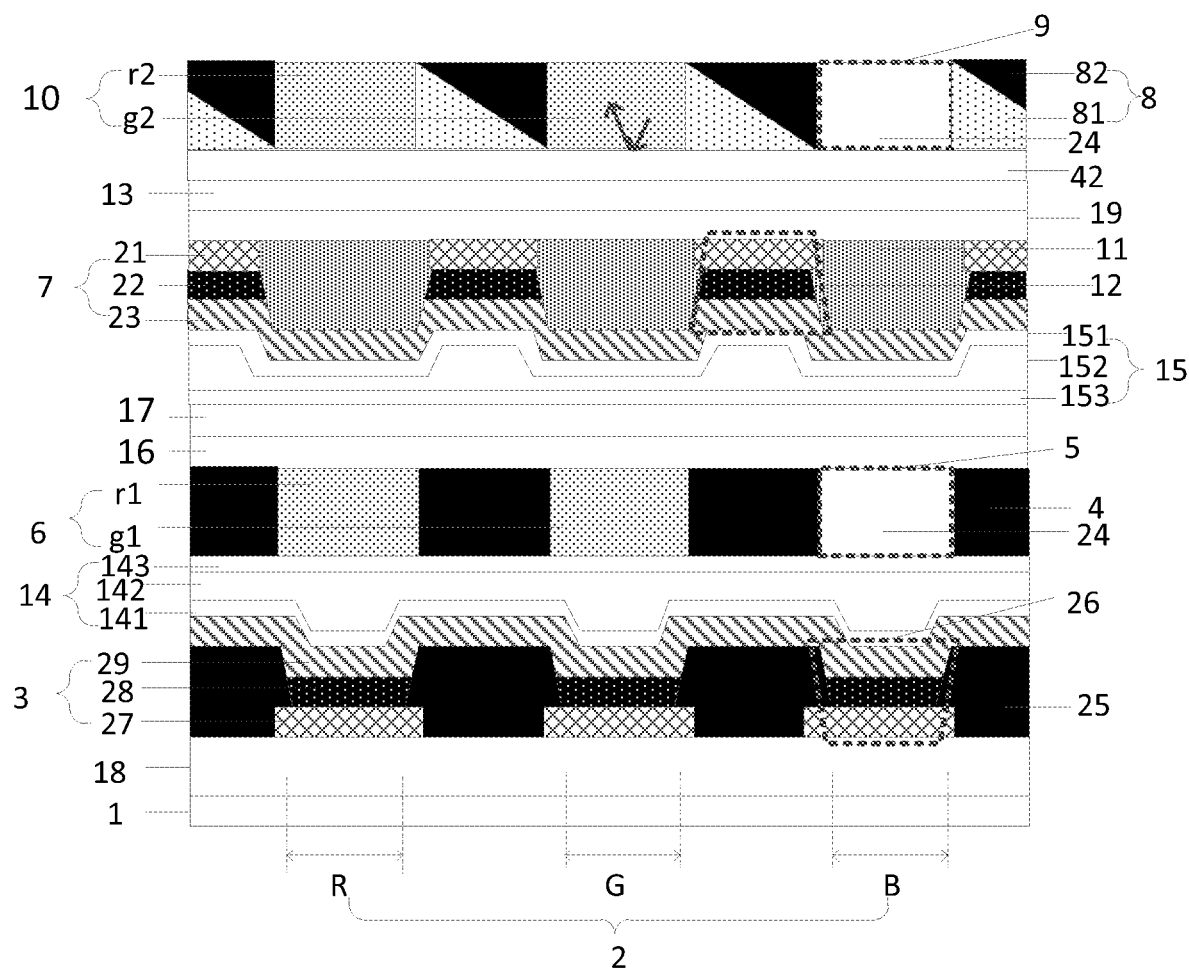
FIG. 10 is a structural schematic diagram of yet another display panel according to an embodiment of the disclosure.

In some embodiments, as shown in FIG. 10, the display panel further includes:

a first filling layer 42 in contact with the second photoluminescent layer 10 on a side of the second photoluminescent layer 10 facing the second light-emitting device 7.

The refractive index of the first filling layer 42 is less than the refractive index of the second photoluminescent layer 10.

In the display panel provided by the embodiments of the disclosure, the refractive index of the first filling layer is less than the refractive index of the second photoluminescent layer, so that the light emitted from the second photoluminescent layer can be totally reflected when reaching the interface between the second photoluminescent layer and the first filling layer. That is, the light emitted from the second photoluminescent layer toward the first base substrate is totally reflected on the interface between the second photoluminescent layer and the first filling layer and thus emitted toward the front of the display panel, improving the light extraction rate of the front of the display panel.

In some implementations, as shown in FIG. 10, when the display panel includes the second base substrate 13, the first filling layer 42 is located between the second photoluminescent layer 10 and the second base substrate 13.

In some embodiments, as shown in FIGS. 1 and 10, the sub-pixel areas 2 includes: a red sub-pixel area R, a green sub-pixel area G, and a blue sub-pixel area B.

In some embodiments, as shown in FIGS. 1 and 10, the first light-emitting devices 3 and the second light-emitting devices 7 are all blue light-emitting devices. The plurality of first photoluminescent layers 6 only include: a first red photoluminescent layer r1 located in the first opening area 5 corresponding to the red sub-pixel area R, and a first green photoluminescent layer g1 located in the first opening area 5 corresponding to the green sub-pixel area G. The plurality of second photoluminescent layers 10 only include: a second red photoluminescent layer r2 located in the second opening area 9 corresponding to the red sub-pixel area R, and a second green photoluminescent layer g2 located in the second opening area 9 corresponding to the green sub-pixel area G.

In some implementations, the first red photoluminescent layer and the second red photoluminescent layer both absorb the blue light and radiate the red light, and the first green photoluminescent layer and the second green photoluminescent layer both absorb the blue light and radiate the green light. Since the first light-emitting devices and the second light-emitting devices are all blue light-emitting devices, the display panel can still achieve the full-color display without arranging a photoluminescent layer in the first opening area or the second opening area corresponding to the blue sub-pixel area B.

In some implementations, the photoluminescent layer includes quantum dots. That is, the first red photoluminescent layer and the second red photoluminescent layer both include red quantum dots that absorb the blue light and radiate the red light, and the first green photoluminescent layer and the second green photoluminescent layer both include green quantum dots that absorb the blue light and radiate the green light.

In some implementations, when the first light-emitting devices and the second light-emitting devices are all blue light-emitting devices, the light-emitting layer corresponding to each sub-pixel area emits the blue light, but the light-emitting spectra of the light-emitting layers corresponding to the sub-pixels may be the same or different.

In some implementations, when the first light-emitting devices and the second light-emitting devices are all blue light-emitting devices, as shown in FIGS. 1 and 10, each of the first opening area 5 and the second opening area 9 corresponding to the blue sub-pixel B further includes a light transmissive filling layer 24.

In some implementations, when the first light-emitting devices and the second light-emitting devices are all blue light-emitting devices and the second dam layer includes a first light transmissive part, the first light transmissive part only transmits the blue light. For example, the wavelength of the light transmitted by the first light transmissive part is greater than or equal to 400 nanometers and less than or equal to 480 nanometers.

Figure 11:
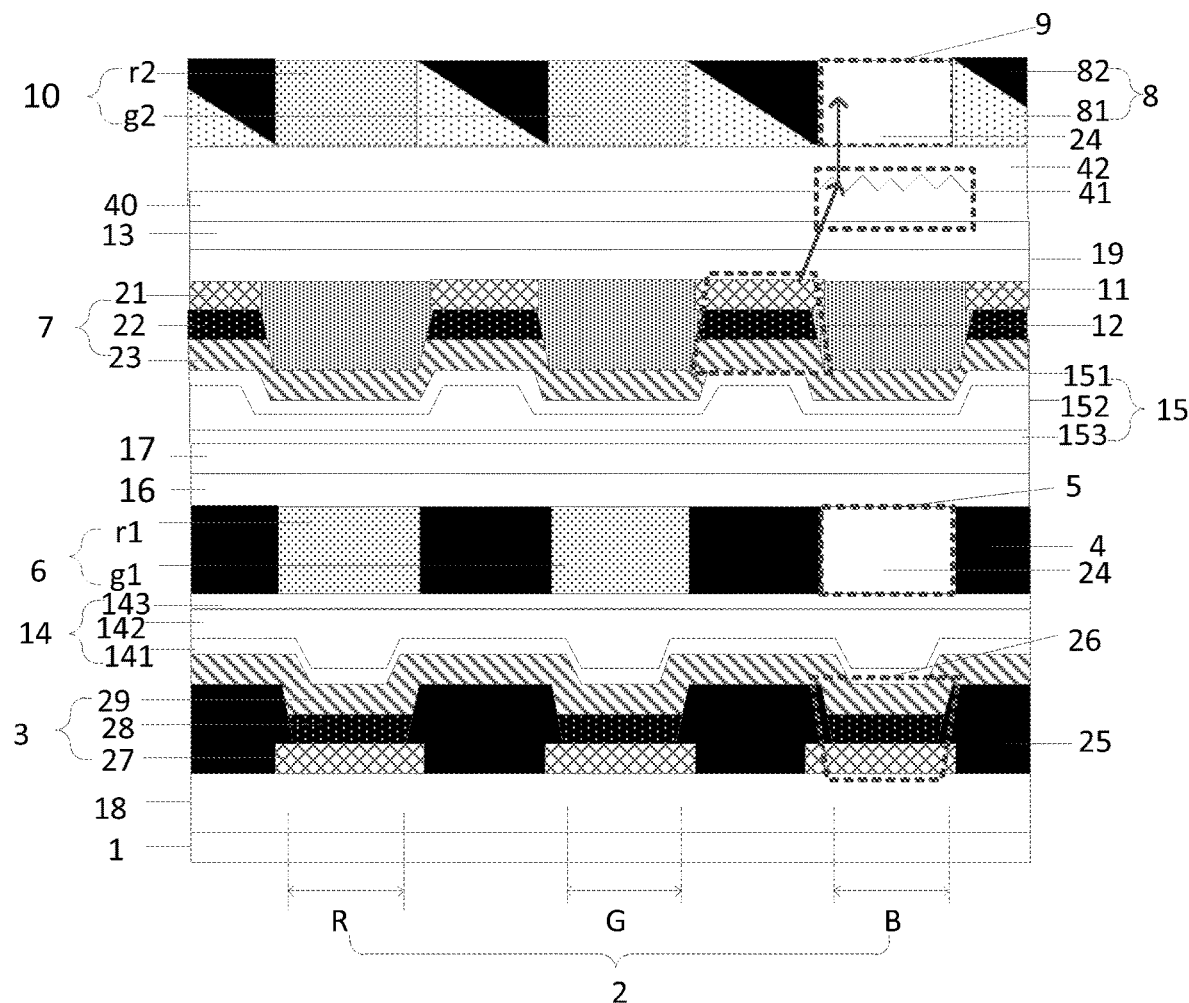
FIG. 11 is a structural schematic diagram of yet another display panel according to an embodiment of the disclosure.

In some embodiments, as shown in FIG. 11, the display panel further includes:

a refractive layer 40 located between the second light-emitting devices 7 and the second dam layer 8, and including lens structures 41 corresponding to the blue sub-pixel areas 2 one by one.

In some implementations, the lens structure is used to refract the light emitted by the second light-emitting device when passing through the lens structure, so as to change the optical path of the light emitted by the second light-emitting device, so that the light emitted by the second light-emitting device is emitted in the direction perpendicular to the first base substrate after passing through the lens structure, thus improving the light extraction rate of the second light-emitting device, and also improving the lifespan of the second light-emitting device.

It should be noted that FIG. 11 takes the prism-type lens structure as an example for illustration. That is, the surface of the lens structure away from the first base substrate has a plurality of sawtooth structures with triangular cross-sections. Of course, in some implementations, the lens structure may also be a concave lens. That is, the surface of the lens structure away from the first base substrate has a curved surface that is concave toward the first base substrate. Alternatively, in some implementations, the lens structure may also have a plurality of structures with semicircular cross-sections on the surface away from the first base substrate.

In some embodiments, as shown in FIG. 11, when the display panel further includes the first filling layer 42, the refractive layer 40 is located between the second base substrate 13 and the first filling layer 42.

In some embodiments, when the first photoluminescent layer and the second photoluminescent layer both include quantum dots, the thickness of the first photoluminescent layer is greater than the thickness of the second photoluminescent layer in the direction perpendicular to the first base substrate.

The mass fraction of the quantum dots in the first photoluminescent layer is greater than the mass fraction of the quantum dots in the second photoluminescent layer.

Therefore, the total quantum dot content and the quantum dot content per unit volume of the first photoluminescent layer are greater than those of the second photoluminescent layer. The light-emission rate of the first photoluminescent layer is greater than the light-emission rate of the second photoluminescent layer.

Figure 12:
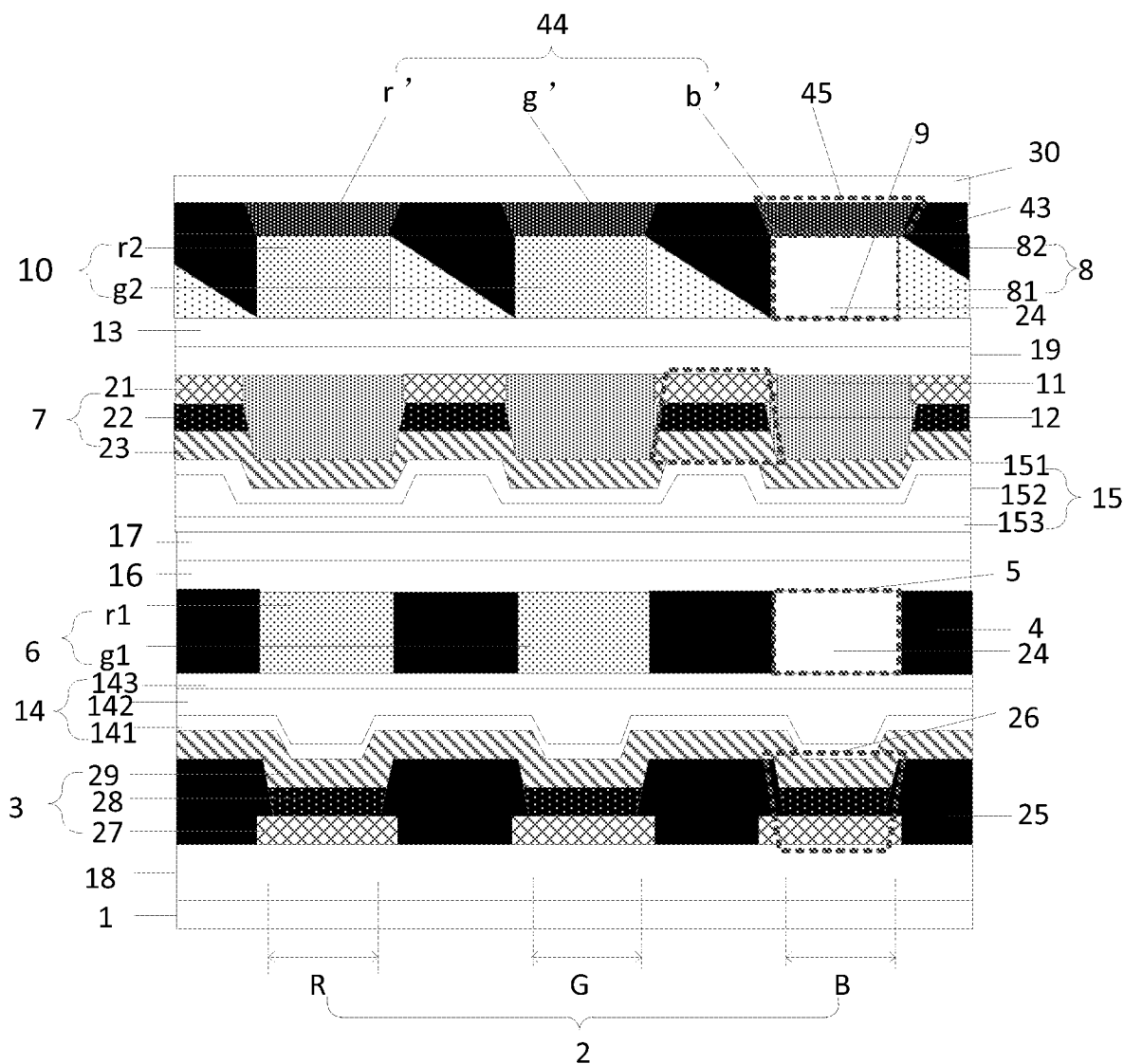
FIG. 12 is a structural schematic diagram of yet another display panel according to an embodiment of the disclosure.
Figure 13:
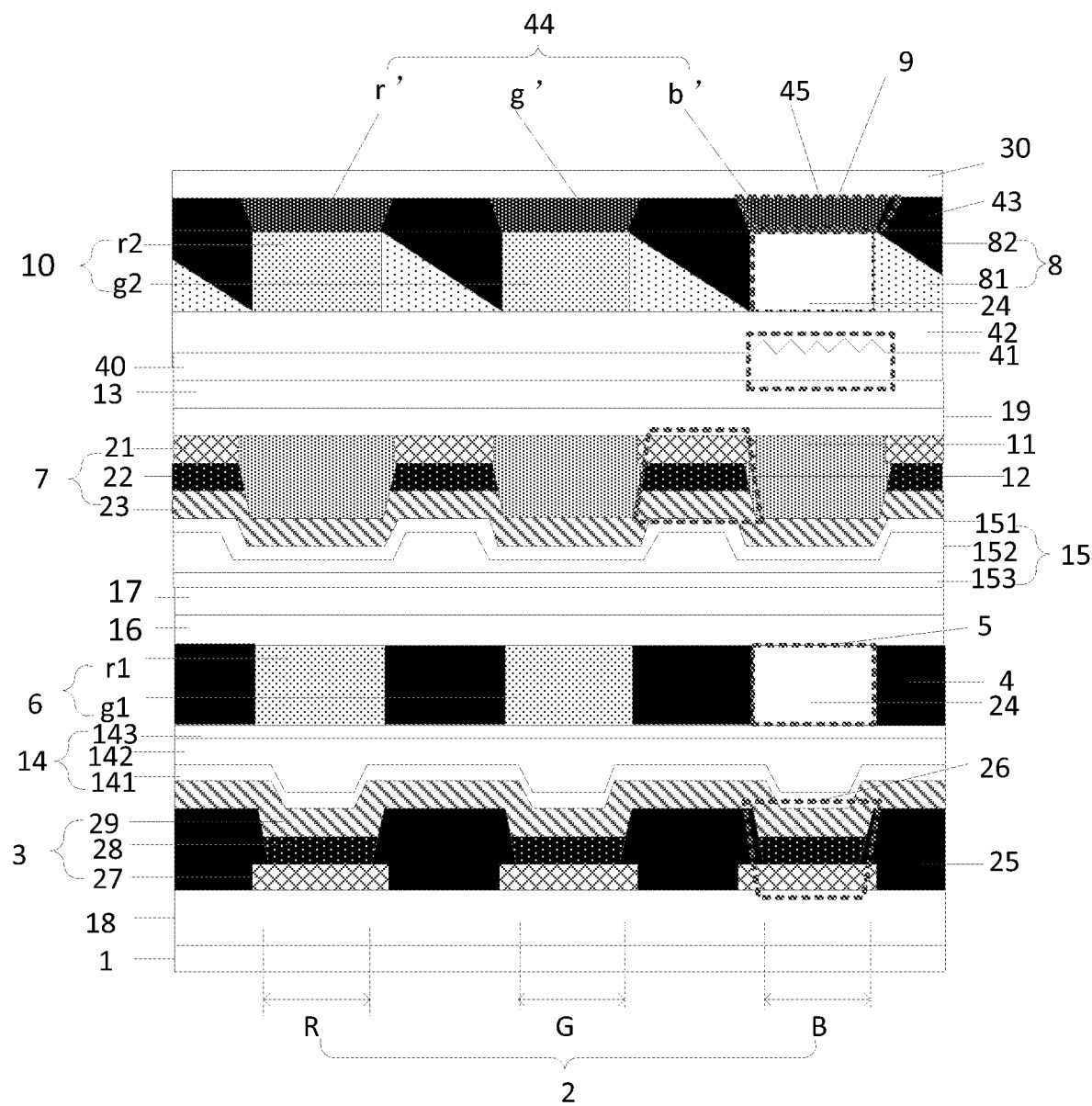
FIG. 13 is a structural schematic diagram of yet another display panel according to an embodiment of the disclosure.

In some embodiments, as shown in FIGS. 12 and 13, the display panel further includes:

a first light-shielding layer 43 located on a side of the second dam layer 8 away from the first base substrate 1 and including fourth opening areas 45 corresponding to the sub-pixel areas 2 one by one; and a plurality of color filters 44 located in the fourth opening areas 45.

In some implementations, the light emitted by the light-emitting devices but not utilized by the photoluminescent layers can be filtered by the color filters, thereby improving the color purity of the display panel.

In some implementations, the plurality of color filters 44 include: a red color filter r' located in the fourth opening area 45 corresponding to the red sub-pixel area R, a green color filter g' located in the fourth opening area 45 corresponding to the green sub-pixel area G, and a blue color filter b' located in the fourth opening area 45 corresponding to the blue sub-pixel area B.

It should be noted that, in the related technology, the light emission luminance of the display panel including a photoluminescent layer with quantum dots attenuates with the viewing angle, and the luminance suddenly drops at large viewing angles, thereby resulting in the poor display effect of the display panel at large viewing angles. The large viewing angle means that the angle relative to the direction perpendicular to the first base substrate is greater than 70°.

In some embodiments, as shown in FIGS. 12 and 13, in the direction in which the first base substrate 1 points to the color filters 44, the cross-sectional areas of the fourth opening areas 45 in the direction perpendicular to the plane where the first base substrate 1 is located increase sequentially. The width of the fourth opening area on a side away from the first base substrate is greater than the width of the second opening area. That is, the shape of the cross section of the fourth opening area 45 in the direction perpendicular to the first base substrate is an inverted trapezoid. Correspondingly the shape of the cross section of the color filter 44 in the direction perpendicular to the first base substrate is an inverted trapezoid, thereby increasing the viewing angle of the partial emitted light, and alleviating the phenomenon that the light emission luminance of the display panel attenuates with the viewing angle and the luminance suddenly drops at large viewing angles.

Figure 14:
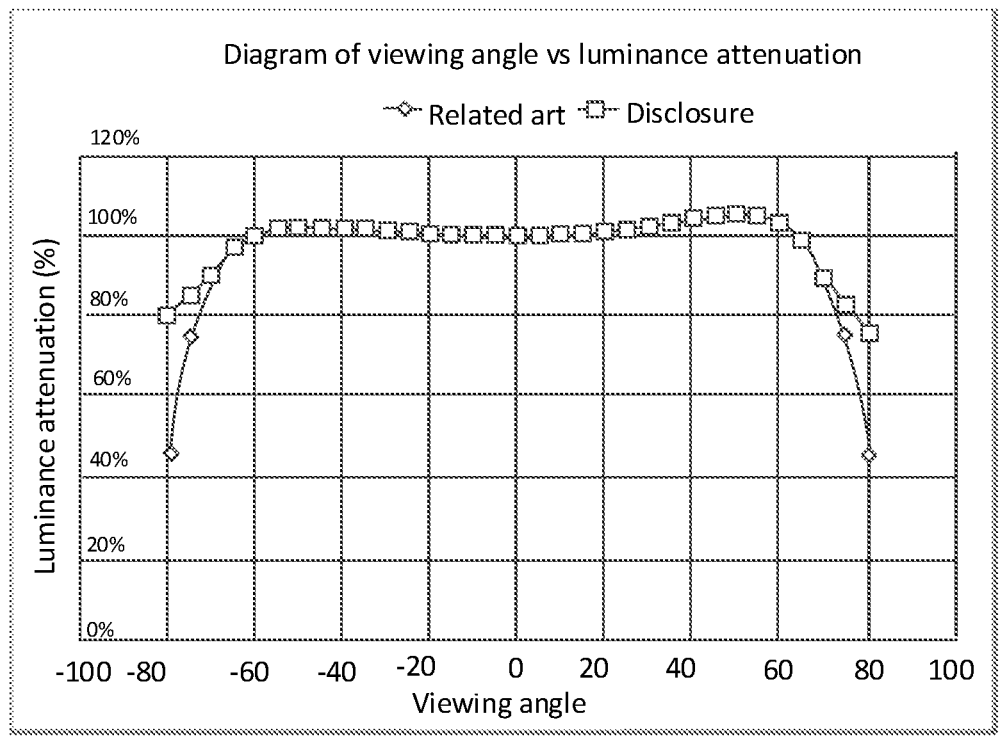
FIG. 14 is an attenuation diagram of the viewing angle brightness according to an embodiment of the disclosure.

It should be noted that a diagram of viewing angle vs luminance attenuation of the display panel provided in the related art and the display panel provided in the embodiments of the disclosure is as shown in FIG. 14. The display panel provided in the related art and the display panel provided in the embodiments of the disclosure each includes the first light-shielding layer and color filters. In the display panel provided in the related art, the shape of the cross section of the fourth opening area in the direction perpendicular to the first base substrate is a rectangle, and correspondingly the shape of the cross section of the color filter in the direction perpendicular to the first base substrate is a rectangle. While in the display panel provided in the embodiments of the disclosure, the shape of the cross section of the fourth opening area in the direction perpendicular to the first base substrate is an inverted trapezoid, and correspondingly the shape of the cross section of the color filter in the direction perpendicular to the first base substrate is an inverted trapezoid. According to FIG. 14, it can be concluded that the luminance attenuation of the display panel provided in the disclosure at large viewing angles is slower than the luminance attenuation of the display panel provided in the related art at large viewing angles, thus alleviating the phenomenon that the light emission luminance of the display panel attenuates with the viewing angle and the luminance suddenly drops at large viewing angles.

In some embodiments, as shown in FIGS. 12 and 13, the display panel further includes:

a cover plate 30 located on a side of the color filters 44 away from the first base substrate 1.

Figure 15:
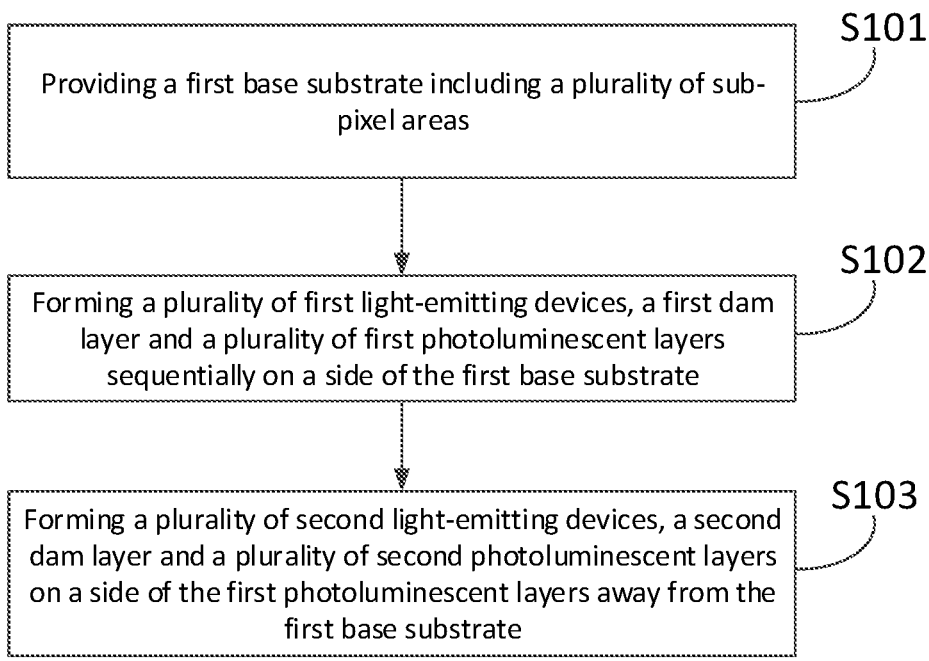
FIG. 15 is a schematic flowchart of a manufacturing method for a display panel according to an embodiment of the disclosure.

Based on the same inventive concept, embodiments of the disclosure further provide a manufacturing method for a display panel, as shown in FIG. 15, including:

S101: providing a first base substrate including a plurality of sub-pixel areas;

S102: forming a plurality of first light-emitting devices, a first dam layer and a plurality of first photoluminescent layers sequentially on a side of the first base substrate; here the first light-emitting devices correspond to the sub-pixel areas one by one, the first dam layer includes first opening areas corresponding to the sub-pixel areas one by one, and the first photoluminescent layers are located in at least part of the first opening areas; and S103: forming a plurality of second light-emitting devices, a second dam layer and a plurality of second photoluminescent layers on a side of the first photoluminescent layers away from the first base substrate; here orthographic projections of the second light-emitting devices on the first base substrate do not overlap with the sub-pixel areas; the second dam layer and the plurality of second photoluminescent layers are located on a side of the second light-emitting devices away from the first base substrate, the second dam layer includes second opening areas corresponding to the sub-pixel areas one by one, and the second photoluminescent layers are located in at least part of the second opening areas.

In the manufacturing method for the display panel provided by the embodiments of the disclosure, the double-layer light-emitting devices and double-layer photoluminescent layers arranged alternately are formed, so that lights of the double-layer light-emitting devices are color-converted and superimposed through different photoluminescent layers respectively, thus improving the light extraction rate of the display panel.

In some embodiments, forming the plurality of second light-emitting devices, the second dam layer and the plurality of second photoluminescent layers on a side of the first photoluminescent layers away from the first base substrate, includes:

providing a second base substrate;

forming the plurality of second light-emitting devices and a first pixel definition layer on a side of the second base substrate; here the first pixel definition layer includes third opening areas corresponding to the second light-emitting devices one by one; the first pixel definition layer includes a first light transmissive material; orthographic projections of the third opening areas on the first base substrate do not overlap with the sub-pixel areas, and the second light-emitting devices are arranged in the third opening areas;

forming the second dam layer on a side of the second base substrate away from the second light-emitting devices, and forming the second opening areas in the second dam layer using a patterning process;

forming the second photoluminescent layers in at least part of the second opening areas; and bonding the side of the second base substrate where the second light-emitting devices are arranged to the side of the first photoluminescent layers away from the first base substrate.

That is, in the manufacturing method for the display panel provided by the embodiments of the disclosure, a second display substrate including the second light-emitting devices, second photoluminescent layers and second dam layer is manufactured independent of a first display substrate including the first light-emitting devices, first photoluminescent layers and first dam layer, and then the display panel is formed through the box-aligning process, so that it is easy to manufacture the display panel including double-layer light-emitting devices and double-layer photoluminescent layers.

In some embodiments, before forming the plurality of first light-emitting devices on a side of the first base substrate, the method further includes:
 forming a first driving circuit layer on the side of the first base substrate.

In some embodiments, forming the first driving circuit layer on the side of the first base substrate includes:
 forming a buffer layer, an active layer, a gate insulating layer, a gate, an interlayer insulating layer, a source and a drain, and a planarization layer in sequence on the side of the first base substrate.

In some embodiments, forming the plurality of first light-emitting devices on the side of the first base substrate, includes:
 forming a pattern of a first anode on a side of the planarization layer away from the first base substrate;
 forming a second pixel definition layer on a side of the first anode away from the first base substrate, and using a patterning process for the second pixel definition layer to form a plurality of sixth opening areas exposing the first anode;
 forming a pattern of a first light-emitting layer in the sixth opening area and on the side of the first anode away from the first base substrate; and
 forming a first cathode on a side of the first light-emitting layer away from the first anode.

In some embodiments, after forming the plurality of first light-emitting devices on the side of the first base substrate and before forming the first dam layer, the method further includes:
 forming a first encapsulation layer on a side of the first cathode away from the first base substrate.

In some embodiments, after forming the first photoluminescent layers, the method further includes:
 forming a first covering layer on a side of the first photoluminescent layers away from the first base substrate.

In some embodiments, forming the plurality of second light-emitting devices and the first pixel definition layer on a side of the second base substrate, includes:
 forming a pattern of a second anode on the side of the second base substrate;
 forming the first pixel definition layer on a side of the second anode away from the second base substrate, and forming a plurality of third opening areas that expose the second anode in the first pixel definition layer;
 forming a pattern of a second light-emitting layer in the third opening area and on a side of the second anode away from the second base substrate; and
 forming a second cathode on a side of the second light-emitting layer away from the second anode.

In some embodiments, before forming the plurality of second light-emitting devices and the first pixel definition layer on the side of the second base substrate, the method further includes:
 forming a second driving circuit layer on the side of the second base substrate.

In some embodiments, forming the second driving circuit layer on the side of the second base substrate includes:
 forming a buffer layer, an active layer, a gate insulating layer, a gate, an interlayer insulating layer, a source and a drain, and a planarization layer in sequence on the side of the second base substrate.

In some embodiments, after forming the plurality of second light-emitting devices, the method further includes:
 forming a second encapsulation layer on a side of the second cathode away from the second base substrate.

In some embodiments, bonding the side of the second base substrate where the second light-emitting devices are arranged to the side of the first photoluminescent layers away from the first base substrate, includes:
 bonding the second encapsulation layer to the first covering layer through a first light transmissive adhesive layer using a box-aligning process.

In some embodiments, when forming the plurality of third opening areas that expose the second anode in the first pixel definition layer, the method further includes:
 forming a plurality of first via holes penetrating a thickness of the first pixel definition layer; here orthographic projections of the third opening areas on the second base substrate fall into areas surrounded by orthographic projections of the first via holes on the second base substrate, and the orthographic projections of the first via holes on the second base substrate do not overlap with orthographic projections of the sub-pixel areas on the second base substrate; and
 filling the first via holes with first reflective parts.

Alternatively, in some embodiments, forming the first pixel definition layer on a side of the second anode away from the second base substrate, and forming the plurality of third opening areas that expose the second anode in the first pixel definition layer, includes:
 depositing a first light transmissive material on the side of the second anode away from the second base substrate to form a first light transmissive material layer, and performing a patterning process on the first light transmissive material layer to form a plurality of five opening areas; and
 depositing a first refractive index material in the fifth opening areas, and performing a patterning process on the first refractive index material to form first reflective parts and the third opening areas; here orthographic projections of the third opening areas on the second base substrate fall into areas surrounded by orthographic projections of the first reflective parts on the second base substrate, and the orthographic projections of the first reflective parts on the second base substrate do not overlap with orthographic projections of the sub-pixel areas on the second base substrate.

In some embodiments, forming the second dam layer on a side of the second base substrate away from the second light-emitting devices, includes:
 forming a pattern of a first light transmissive part on the side of the second base substrate away from the second light-emitting devices; and
 forming a pattern of a second reflective part on a side of the first light transmissive part away from the second base substrate.

The specific patterns of the first light transmissive part and the second reflective part refer to the discussion in the section of the display panel, and will not be described again here.

In some embodiments, before forming the second dam layer on a side of the second base substrate away from the second light-emitting devices, the method further includes:

forming a first filling layer on the side of the second base substrate away from the second light-emitting devices; here a refractive index of the first filling layer is less than a refractive index of the second photoluminescent layer.

In some embodiments, the sub-pixel areas include: a red sub-pixel area, a green sub-pixel area and a blue sub-pixel area. The first light-emitting devices and the second light-emitting devices are all blue light-emitting devices. Forming the second photoluminescent layers in at least part of the second opening areas includes:

forming a second red photoluminescent layer in the second opening area corresponding to the red sub-pixel area, and forming a second green photoluminescent layer in the second opening area corresponding to the green sub-pixel area.

In some embodiments, before forming the second dam layer on a side of the second base substrate away from the second light-emitting devices, the method further includes:

forming a refractive layer on the side of the second base substrate away from the second light-emitting devices, and using a nanoimprint process for a surface of the refractive layer away from the second base substrate in an area corresponding to the blue sub-pixel area to form a lens structure.

In some implementations, when the display panel includes the first filling layer and the refractive layer, the refractive layer and the lens structure are firstly formed on the side of the second base substrate away from the second light-emitting devices, and then the first filling layer covering the refractive layer is formed.

In some embodiments, after forming the second photoluminescent layers in at least part of the second opening areas, the method further includes:

forming a first light-shielding layer on a side of the second photoluminescent layers away from the second base substrate, and performing a patterning process on the first light-shielding layer to form fourth opening areas corresponding to the sub-pixel areas one by one; and forming color filters in the fourth opening areas.

In some embodiments, after forming the color filters in the fourth opening areas, the method further includes:

forming a cover plate on a side of the color filters away from the second base substrate.

In some implementations, after the first light-shielding layer, color filters and cover plate are formed, the second encapsulation layer is bonded to the first covering layer through the first light transmissive adhesive layer using the box-aligning process.

Based on the same inventive concept, embodiments of the disclosure further provide a display device, including the display panel provided by the embodiments of the disclosure.

The display device according to the embodiments of the disclosure is a mobile phone, a tablet, a television, a display, a laptop, a digital photo frame, a navigator, a car window, or any other product or component with display function. All of other indispensable components of the display device should be understood by those ordinary skilled in the art to be included, and will be omitted here and should not be considered as limitations on the disclosure. The implementations of the display device can refer to the embodiments of the above-mentioned display panel, and the repeated description thereof will be omitted here.

Figure 16:
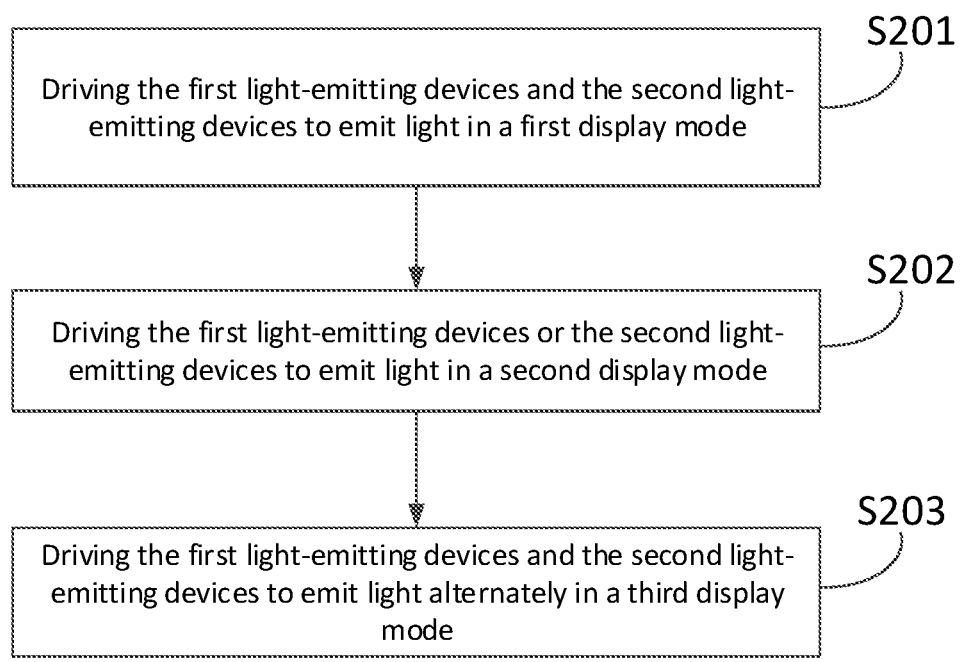
FIG. 16 is a schematic flowchart of a driving method for a display device according to an embodiment of the disclosure.

Based on the same inventive concept, embodiments of the disclosure further provide a driving method for a display device, as shown in FIG. 16, including:

S201: driving the first light-emitting devices and the second light-emitting devices to emit light in a first display mode.

In the driving method for the display device provided by the embodiments of the disclosure, since the display device includes double-layer light-emitting devices and double-layer photoluminescent layers, both the first light-emitting devices and the second light-emitting devices can be driven to emit light, so that lights of the double-layer light-emitting devices are color-converted and superimposed through different photoluminescent layers respectively, thus improving the light extraction rate of the display device.

In some implementations, for application scenarios with high requirement on light emission luminance, both the first light-emitting devices and the second light-emitting devices can be driven to emit light, to improve the light emission luminance and contrast of the display device.

In some implementations, when the display device is applied to the in-vehicle display such as in-vehicle window, etc., the luminance requirement is not high, but both the first light-emitting devices and the second light-emitting devices can still be driven to emit light, and the first light-emitting devices and the second light-emitting devices can be controlled to have relatively low light emission luminance. That is, the luminance when the first light-emitting devices and the second light-emitting devices emit light at the same time is lower than the luminance when only one layer of light-emitting devices emit light, thereby increasing the lifespan of the first light-emitting devices and the second light-emitting devices.

In some embodiments, as shown in FIG. 16, the method further includes:

S202: driving the first light-emitting devices or the second light-emitting devices to emit light in a second display mode.

In some implementations, for application scenarios with low requirement on light emission luminance, only one of the first light-emitting devices and the second light-emitting devices can be driven to emit light, thereby achieving the low-power display.

In some embodiments, as shown in FIG. 16, the method further includes:

S203: driving the first light-emitting devices and the second light-emitting devices to emit light alternately in a third display mode.

In some implementations, for application scenarios with low requirement on light emission luminance, the first light-emitting devices and the second light-emitting devices can be driven to emit light alternately, thereby improving the lifespan of the first light-emitting devices and the second light-emitting devices.

In summary, the embodiments of the disclosure provide the display panel and the manufacturing method therefor, and the display device and the driving method therefor. The display panel includes double-layer light-emitting devices and double-layer photoluminescence layers that are alternately arranged, so that lights of the double-layer light-emitting devices are color-converted and superimposed through different photoluminescent layers respectively, thus improving the light extraction rate of the display panel. Also, the light emitted by the first light-emitting devices but not utilized by the first photoluminescent layers can be used again when reaching the second photoluminescent layers, thus improving the light utilization rate of the first light-emitting devices. Moreover, the first light-emitting devices are located in the first openings corresponding to the sub-pixel areas, and the orthographic projections of the second light-emitting devices on the first base substrate do not overlap with the sub-pixel areas, that is, the orthographic projections of the first light-emitting devices and the second light-emitting devices on the first base substrate are spaced apart from each other, to avoid the second light-emitting devices from affecting the light extraction rate of the first light-emitting devices.

Although the preferred embodiments of the invention have been described, those skilled in the art can make additional alterations and modifications to these embodiments once they learn about the basic creative concepts. Thus the attached claims are intended to be interpreted to include the preferred embodiments as well as all the alterations and modifications falling within the scope of the invention.

Evidently those skilled in the art can make various modifications and variations to the embodiments of the invention without departing from the spirit and scope of the embodiments of the invention. Thus the invention is also intended to encompass these modifications and variations therein as long as these modifications and variations to the embodiments of the invention come into the scope of the claims of the invention and their equivalents.

What is claimed is:

1. A display panel, comprising:
   a first base substrate comprising a plurality of sub-pixel areas;
   a plurality of first light-emitting devices on a side of the first base substrate and corresponding to the sub-pixel areas one by one;
   a first dam layer on a side of the first light-emitting devices away from the first base substrate and comprising first opening areas corresponding to the sub-pixel areas one by one;
   a plurality of first photoluminescent layers on the side of the first light-emitting devices away from the first base substrate and in at least part of the first opening areas;
   a plurality of second light-emitting devices on a side of the first dam layer away from the first light-emitting devices, wherein orthographic projections of the second light-emitting devices on the first base substrate do not overlap with the sub-pixel areas;
   a second dam layer on a side of the second light-emitting devices away from the first base substrate and comprising second opening areas corresponding to the sub-pixel areas one by one; and
   a plurality of second photoluminescent layers on the side of the second light-emitting devices away from the first base substrate and in at least part of the second opening areas.

2. The display panel according to claim 1, further comprising:
   a first pixel definition layer between the first photoluminescence layers and the second photoluminescence layers and comprising third opening areas corresponding to the second light-emitting devices one by one; wherein the first pixel definition layer comprises a first light transmissive material, orthographic projections of the third opening areas on the first base substrate do not overlap with the sub-pixel areas, and the second light-emitting devices are arranged in the third opening areas.

3. The display panel according to claim 2, wherein the first light-emitting device comprises: a first anode, a first light-emitting layer and a first cathode stacked on the side of the first base substrate;
   the display panel further comprises:
   a second base substrate between the second light-emitting devices and the second photoluminescent layers;
   the second light-emitting device comprises:
   a second anode on a side of the second base substrate away from the second photoluminescence layers; wherein an orthographic projection of the third opening area on the second base substrate falls into an orthographic projection of the second anode on the second base substrate; and the second anode is a light transmissive electrode;
   a second light-emitting layer on a side of the second anode facing the first dam layer in the third opening area; and
   a second cathode on a side of the second light-emitting layer away from the second anode.

4. The display panel according to claim 3, wherein a cross-sectional area of the third opening area in a direction parallel to a plane where the second base substrate is located gradually decreases in a direction in which the first base substrate points to the second base substrate.

5. The display panel according to claim 4, wherein the first pixel definition layer comprises a plurality of first reflective parts corresponding to the third opening areas one by one; and
   orthographic projections of the third opening areas on the second base substrate fall into areas surrounded by orthographic projections of the first reflective parts on the second base substrate, and the orthographic projections of the first reflective parts on the second base substrate do not overlap with orthographic projections of the sub-pixel areas on the second base substrate.

6. The display panel according to claim 5, wherein the first pixel definition layer comprises first via holes penetrating in a thickness direction of the first pixel definition layer, and the first reflective parts are filled in the first via holes.

7. The display panel according to claim 6, wherein the first reflective part comprises a reflective metal material;
   an orthographic projection of the first reflective part on the second base substrate does not overlap with an orthographic projection of the second anode on the second base substrate; and
   the first reflective part is in contact with the second cathode.

8. The display panel according to claim 5, wherein:
   the first pixel definition layer has a transmittance greater than or equal to 80% for light with a wavelength greater than or equal to 380 nanometers and less than or equal to 780 nanometers; and/or
   the first reflective part comprises a first refractive index material; and a refractive index of the second light-emitting layer is greater than a refractive index of the first refractive index material; and/or
   a refractive index of the first light transmissive material is greater than the refractive index of the first refractive index material.

9. The display panel according to claim 1, wherein the second dam layer comprises: a first light transmissive part and a second reflective part on a side of the first light transmissive part away from the first base substrate; the first light transmissive part only transmits light emitted by the second light-emitting devices; and a refractive index of the first light transmissive part is greater than a refractive index of the second reflective part;

an angle between at least part of an interface between the first light transmissive part and the second reflective part and a direction perpendicular to a plane where the first base substrate is located is greater than 0 and less than 90°; and an orthographic projection of the second reflective part on the first base substrate covers an orthographic projection of the first light transmissive part on the first base substrate.

10. The display panel according to claim 9, wherein:
a cross section of the second dam layer is a rectangle, and cross sections of the first light transmissive part and the second reflective part are both right triangles, in a direction perpendicular to the first base substrate; or
a cross section of the second dam layer is a triangle, and a cross section of the first light transmissive part is a triangle, in a direction perpendicular to the first base substrate; or
a cross section of the second dam layer is a trapezoid, and a cross section of the first light transmissive part is a trapezoid, in a direction perpendicular to the first base substrate; or
a cross-sectional area of the first light transmissive part is less than a cross-sectional area of the second dam layer, and a cross section of the first light transmissive part and a cross section of the second dam layer are similar in shape.

11. The display panel according to claim 1, further comprising:
a first filling layer in contact with the second photoluminescent layers on a side of the second photoluminescent layers facing the second light-emitting devices; wherein a refractive index of the first filling layer is less than a refractive index of the second photoluminescent layers.

12. The display panel according to claim 1, wherein the sub-pixel areas comprise: a red sub-pixel area, a green sub-pixel area and a blue sub-pixel area; and
the first light-emitting devices and the second light-emitting devices are all blue light-emitting devices; the plurality of first photoluminescent layers only comprise: a first red photoluminescent layer in the first opening area corresponding to the red sub-pixel area, and a first green photoluminescent layer in the first opening area corresponding to the green sub-pixel area; and the plurality of second photoluminescent layers only comprise: a second red photoluminescent layer in the second opening area corresponding to the red sub-pixel area, and a second green photoluminescent layer in the second opening area corresponding to the green sub-pixel area.

13. The display panel according to claim 12, further comprising:
a refractive layer between the second light-emitting devices and the second dam layer, and comprising lens structures corresponding to the blue sub-pixel areas one by one.

14. The display panel according to claim 1, wherein the first photoluminescent layer and the second photoluminescent layer each comprise quantum dots;
a thickness of the first photoluminescent layer is greater than a thickness of the second photoluminescent layer in a direction perpendicular to the first base substrate; and
a mass fraction of the quantum dots in the first photoluminescent layer is greater than a mass fraction of the quantum dots in the second photoluminescent layer.

15. The display panel according to claim 1, further comprising:
a first encapsulation layer between the first light-emitting devices and the first photoluminescent layers;
a second encapsulation layer between the second light-emitting devices and the first photoluminescent layers;
a first covering layer between the first photoluminescent layers and the second encapsulation layer; and
a first light transmissive adhesive layer between the second encapsulating layer and the first covering layer.

16. The display panel according to claim 1, further comprising:
a first light-shielding layer on a side of the second dam layer away from the first base substrate and comprising fourth opening areas corresponding to the sub-pixel areas one by one; and
color filters in the fourth opening areas.

17. The display panel according to claim 16, wherein in a direction in which the first base substrate points to the color filters, cross-sectional areas of the fourth opening areas in a direction parallel to a plane where the first base substrate is located increase sequentially, and a width of the fourth opening area on a side away from the first base substrate is greater than a width of the second opening area.

18. A display device, comprising the display panel according to claim 1.

19. A manufacturing method for a display panel, comprising:
providing a first base substrate comprising a plurality of sub-pixel areas;
forming a plurality of first light-emitting devices, a first dam layer and a plurality of first photoluminescent layers sequentially on a side of the first base substrate; wherein the first light-emitting devices correspond to the sub-pixel areas one by one, the first dam layer comprises first opening areas corresponding to the sub-pixel areas one by one, and the first photoluminescent layers are in at least part of the first opening areas; and
forming a plurality of second light-emitting devices, a second dam layer and a plurality of second photoluminescent layers on a side of the first photoluminescent layers away from the first base substrate; wherein orthographic projections of the second light-emitting devices on the first base substrate do not overlap with the sub-pixel areas; the second dam layer and the plurality of second photoluminescent layers are on a side of the second light-emitting devices away from the first base substrate, the second dam layer comprises second opening areas corresponding to the sub-pixel areas one by one, and the second photoluminescent layers are in at least part of the second opening areas.

20. A driving method for a display device comprising a display panel, wherein the display panel comprises:
a first base substrate comprising a plurality of sub-pixel areas;
a plurality of first light-emitting devices on a side of the first base substrate and corresponding to the sub-pixel areas one by one;
a first dam layer on a side of the first light-emitting devices away from the first base substrate and comprising first opening areas corresponding to the sub-pixel areas one by one;
a plurality of first photoluminescent layers on the side of the first light-emitting devices away from the first base substrate and in at least part of the first opening areas;

a plurality of second light-emitting devices on a side of the first dam layer away from the first light-emitting devices, wherein orthographic projections of the second light-emitting devices on the first base substrate do not overlap with the sub-pixel areas;

a second dam layer on a side of the second light-emitting devices away from the first base substrate and comprising second opening areas corresponding to the sub-pixel areas one by one; and a plurality of second photoluminescent layers on the side of the second light-emitting devices away from the first base substrate and in at least part of the second opening areas;

wherein the driving method comprises:

driving the first light-emitting devices and the second light-emitting devices to emit light in a first display mode;

driving the first light-emitting devices or the second light-emitting devices to emit light in a second display mode;

driving the first light-emitting devices and the second light-emitting devices to emit light alternately in a third display mode.

* * * * *